United States Patent
Babakhani et al.

(10) Patent No.: US 12,250,014 B2
(45) Date of Patent: Mar. 11, 2025

(54) THz IMPULSE AND FREQUENCY COMB GENERATION USING REVERSE RECOVERY OF PIN DIODE

(71) Applicant: The Regents of the University of California, Oakland, CA (US)

(72) Inventors: Aydin Babakhani, Los Angeles, CA (US); Seyedmohammadreza Razavian, San Diego, CA (US)

(73) Assignee: The Regents of the University of California, Oakland, CA (US)

( * ) Notice: Subject to any disclaimer, the term of this patent is extended or adjusted under 35 U.S.C. 154(b) by 37 days.

(21) Appl. No.: 17/596,963

(22) PCT Filed: Jun. 26, 2020

(86) PCT No.: PCT/US2020/039800
§ 371 (c)(1),
(2) Date: Dec. 22, 2021

(87) PCT Pub. No.: WO2020/264279
PCT Pub. Date: Dec. 30, 2020

(65) Prior Publication Data
US 2022/0247437 A1   Aug. 4, 2022

Related U.S. Application Data

(60) Provisional application No. 62/866,954, filed on Jun. 26, 2019.

(51) Int. Cl.
*H04B 1/10* (2006.01)
*H01Q 9/28* (2006.01)
(Continued)

(52) U.S. Cl.
CPC .............. *H04B 1/10* (2013.01); *H01Q 9/28* (2013.01); *H01Q 13/10* (2013.01); *H03D 7/12* (2013.01); *H03K 3/01* (2013.01)

(58) Field of Classification Search
CPC ...................................................... H04B 1/10
(Continued)

(56) References Cited

U.S. PATENT DOCUMENTS 4,675,872 A * 6/1987 Popek ..................... H01S 3/115
                                                          372/25
4,837,735 A * 6/1989 Allen, Jr. ................ G06N 5/046
                                                          706/50
(Continued)

FOREIGN PATENT DOCUMENTS

| EP | 3991247 A1 | 5/2022 |
|---|---|---|
| WO | 2020264279 A1 | 12/2020 |
| WO | 2023108085 A1 | 6/2023 |

OTHER PUBLICATIONS

Extended European Search Report for European Application No. 20831237.1, Search completed May 3, 2023, Mailed May 15, 2023, 13 Pgs.
(Continued)

*Primary Examiner* — Lihong Yu
(74) *Attorney, Agent, or Firm* — KPPB LLP

(57) ABSTRACT

Many embodiments provide a frequency comb receiver that includes a PIN diode, a THz pulse generator block that generates THz tones (LO) for coherent frequency comb detection, an on-chip antenna for broadband detection and a driver stage switched by a series of buffers, where a repetition rate of the LO tones are tunable over a range and determines a spacing between two adjacent tones in the corresponding frequency comb.

20 Claims, 19 Drawing Sheets

(51) Int. Cl.
 *H01Q 13/10* (2006.01)
 *H03D 7/12* (2006.01)
 *H03K 3/01* (2006.01)
(58) Field of Classification Search
 USPC .......................................................... 375/349
 See application file for complete search history.

(56) References Cited

U.S. PATENT DOCUMENTS

| | | | |
|---|---|---|---|
| 5,508,661 A * | 4/1996 | Keane ..................... | H01P 1/218 |
| | | | 455/313 |
| 9,438,249 B1 | 9/2016 | Nguyen et al. | |
| 9,948,291 B1 * | 4/2018 | Weigand ................ | H03K 17/74 |
| 10,211,528 B2 | 2/2019 | Assefzadeh et al. | |
| 10,222,468 B2 | 3/2019 | Assefzadeh et al. | |
| 10,564,248 B1 * | 2/2020 | Simons ..................... | H03F 3/24 |
| 2002/0130331 A1 * | 9/2002 | Nemoto ................ | H01L 29/868 |
| | | | 257/493 |
| 2004/0018018 A1 | 1/2004 | Izadpanah | |
| 2004/0166817 A1 | 8/2004 | Mokhtari et al. | |
| 2006/0039449 A1 | 2/2006 | Fontana et al. | |
| 2006/0076493 A1 | 4/2006 | Bluzer | |
| 2007/0120677 A1 | 5/2007 | Park et al. | |
| 2008/0067632 A1 | 3/2008 | Silver et al. | |
| 2010/0033709 A1 | 2/2010 | Lampin et al. | |
| 2010/0036369 A1 | 2/2010 | Hancock | |
| 2010/0213375 A1 | 8/2010 | Loeffler et al. | |
| 2012/0212383 A1 | 8/2012 | Sengupta et al. | |
| 2012/0299770 A1 | 11/2012 | Lee | |
| 2014/0091376 A1 | 4/2014 | Boppel et al. | |
| 2014/0191351 A1 | 7/2014 | Sertel et al. | |
| 2015/0263424 A1 | 9/2015 | Sanford et al. | |
| 2015/0288393 A1 * | 10/2015 | Han ........................ | H04L 27/04 |
| | | | 375/295 |
| 2016/0097718 A1 | 4/2016 | Tekin et al. | |
| 2016/0149441 A1 | 5/2016 | Nayak | |
| 2016/0338798 A1 | 11/2016 | Vora et al. | |
| 2016/0344108 A1 | 11/2016 | Assefzadeh et al. | |
| 2018/0019755 A1 | 1/2018 | Josefsberg et al. | |
| 2018/0041166 A1 | 2/2018 | Han et al. | |
| 2018/0052186 A1 | 2/2018 | Su et al. | |
| 2018/0348431 A1 | 12/2018 | Bassett et al. | |
| 2018/0373905 A1 | 12/2018 | Gravelle et al. | |
| 2019/0280389 A1 * | 9/2019 | Song ..................... | H01Q 13/103 |
| 2021/0018610 A1 | 1/2021 | Babakhani et al. | |

OTHER PUBLICATIONS

International Preliminary Report on Patentability for International Application No. PCT/US2020/039800, Report issued Dec. 28, 2021, Mailed on Jan. 6, 2022, 6 Pgs.
International Search Report and Written Opinion for International Application No. PCT/US2020/039800, Search completed Aug. 22, 2020, Mailed Sep. 11, 2020, 13 Pgs.
Aggrawal et al., "Gone in a Picosecond: Techniques for the Generation and Detection of Picosecond Pulses and their Applications", IEEE Microwave Magazine, IEEE Service Center, Piscataway, NJ, US, Dec. 1, 2016, vol. 17, No. 12, pp. 24-38, XP011634104, ISSN: 1527-3342, DOI: 10.1109/MMM.2016.2608764 [retrieved on Nov. 10, 2016].
Arbabian et al., "A 94 GHz mm-Wave-to-Baseband Pulsed-Radar Transceiver with Applications in Imaging and Gesture Recognition", IEEE Journal of Solid-State Circuits, vol. 48, No. 4, Apr. 2013, pp. 1055-1071, DOI: 10.1109/JSSC.2013.2239004.
Assefzadeh et al., "Broadband Oscillator-Free THz Pulse Generation and Radiation Based on Direct Digital-to-Impulse Architecture", IEEE Journal of Solid-State Circuits, vol. 52, No. 11, Nov. 2017, Date of Publication: Aug. 30, 2017, pp. 2905-2919, DOI: 10.1109/JSSC.2017.2739180.
Chen et al., "A Nonlinear Q-Switching Impedance Technique for Picosecond Pulse Radiation in Silicon", IEEE Transactions on Microwave Theory and Techniques, vol. 64, No. 12, Dec. 2016, pp. 4685-4700, DOI: 10.1109/TMTT.2016.2623700.
Han et al., "A 260GHz broadband source with 1.1mW continuous-wave radiated power and EIRP of 15.7dBm in 65nm CMOS", IEEE International Conference on Solid-State Circuits (ISSCC), Feb. 17-21, 2013, San Francisco, CA, USA, pp. 138-139, DOI: 10.1109/ISSCC.2013.6487671.
Schunemann et al., "A charge-control model of the pin diode", IEEE Transactions on Electron Devices, vol. 23, No. 10, Oct. 1976, pp. 1150-1158, DOI: 10.1109/T-ED.1976.18561.
Wu et al., "Dynamic waveform shaping for reconfigurable radiated periodic signal generation with picosecond time-widths", Custom Integrated Circuits Conference (CICC), Sep. 28-30, 2015, San Jose, CA, USA, pp. 1-4, DOI: 10.1109/CICC.2015.7338411.
Andersen et al., "A 118-mw pulse-based radar soc in 55-nm cmos for non-contact human vital signs detection", IEEE Journal of Solid-State Circuits, vol. 52, No. 12, pp. 3421-3433, 2017.
Besnoff et al., "Battery-free multichannel digital ECG biotelemetry using UHF RFID techniques", 2013 IEEE International Conference on RFID, 2013, pp. 16-22.
Bourdel et al., "A 9-pJ/pulse 1.42-Vpp OOK CMOS UWB pulse generator for the 3.1-10.6-GHz FCC band", IEEE Transactions on Microwave Theory and Techniques, vol. 58, No. 1, 2009, pp. 65-73.
Chae et al., "A 128-channel 6 mW wireless neural recording IC with spike feature extraction and UWB transmitter", IEEE Transactions on Neural Systems and Rehabilitation Engineering, vol. 17, No. 4, 2009, pp. 312-321.
Cruz et al., "Hybrid UHF/UWB antenna for passive indoor identification and localization systems", IEEE Transactions on Antennas and Propagation, vol. 61, No. 1, pp. 354-361, 2012.
Dickson, "On-chip high-voltage generation in MNOS integrated circuits using an improved voltage multiplier technique", IEEE Journal of Solid-State Circuits, vol. 11, No. 3, 1976, pp. 374-378, http://dx.doi.org/10.1109/JSSC.1976.1050739.
Kang et al., "Design and Optimization of Area-Constrained Wirelessly Powered CMOS UWB SoC for localization applications", IEEE Transactions on Microwave Theory and Techniques, Apr. 2016, vol. 64, No. 4, pp. 1042-1054, DOI: 10.1109/TMTT.2016.2536663.
Koski et al., "Fundamental Characteristics of Electro-Textiles in Wearable UHF RFID Patch Antennas for Body-Centric Sensing Systems", IEEE Transactions on Antennas and Propagation, vol. 62, No. 12, Dec. 2014, Date of Publication: Oct. 20, 2014, pp. 6454-6462.
Le et al., "Efficient Far-Field Radio Frequency Energy Harvesting for Passively Powered Sensor Networks", IEEE Journal of Solid-State Circuits, May 2008, vol. 43, No. 5, pp. 1287-1302, DOI: 10.1109/JSSC.2008.920318.
Lu et al., "Performance evaluation of a long-range RFID tag powered by a vibration energy harvester", IEEE Antennas and Wireless Propagation Letters, vol. 16, 2017, pp. 1832-1835.
Lyu et al., "A 100-M/s 2.6-pJ/pulse compact UWB impulse transmitter based on antenna-and-pulsegenerator codesign", IEICE Electronics Express, vol. 16, No. 24, 2019, pp. 20190672-20190672.
Lyu et al., "A 430-Mhz Wirelessly Powered Implantable Pulse Generator With Intensity/Rate Control and Sub-1 µA Quiescent Current Consumption", IEEE Transactions on Biomedical Circuits and Systems, vol. 13, No. 1, Feb. 2019, pp. 180-190, DOI: 10.1109/TBCAS.2018.2879357.
Lyu et al., "A 915-MHz Far-Field Energy Harvester With--22-dBm Sensitivity and 3-V Output Voltage Based on Antenna-and-Rectifier Codesign", IEEE Microwave and Wireless Components Letters, vol. 29, No. 8, 2019, pp. 557-559.
Lyu et al., "An Energy-Efficient Wirelessly Powered Millimeter-Scale Neurostimulator Implant Based on Systematic Codesign of an Inductive Loop Antenna and a Custom Rectifier", IEEE Transactions on Biomedical Circuits and Systems, vol. 12, No. 5, Oct. 2018, pp. 1131-1143, DOI: 10.1109/TBCAS.2018.2852680.
Marrocco et al., "The art of UHF RFID antenna design: Impedancematching and size-reduction techniques", IEEE Antennas and Propagation Magazine, vol. 50, No. 1, 2008, pp. 66-79.

(56) References Cited

OTHER PUBLICATIONS

Nikitin et al., "Power reflection coefficient analysis for complex impedances in RFID tag design", IEEE Transactions on Microwave Theory and Techniques, vol. 53, No. 9, 2005, pp. 2721-2725.
Occhiuzzi et al., "Modeling, design and experimentation of wearable RFID sensor tag", IEEE Transactions on Antennas and Propagation, vol. 58, No. 8, 2010, pp. 2490-2498.
Riaz et al., "A novel design of UHF RFID passive tag antenna targeting smart cards limited area", 2018 IEEE International Conference on Consumer Electronics (ICCE), 2018, pp. 1-4.
Schleircher et al., "IR-UWB radar demonstrator for ultra-fine movement detection and vital-sign monitoring", IEEE transactions on microwave theory and techniques, vol. 61, No. 5, pp. 2076-2085, 2013.
Stoopman et al., "Co-Design of a CMOS Rectifier and Small Loop Antenna for Highly Sensitive RF Energy Harvesters", IEEE Journal of Solid-State Circuits, Mar. 2014, vol. 49, Issue 3, pp. 622-634, DOI: 10.1109/JSSC.2014.2302793.
Tan et al., "A 1.2-V 8.3-nJ CMOS humidity sensor for RFID applications", IEEE Journal of Solid-State Circuits, vol. 48, No. 10, pp. 2469-2477, 2013.
Vaz et al., "Full passive UHF tag with a temperature sensor suitable for human body temperature monitoring", IEEE Transactions on Circuits and Systems II: Express Briefs, vol. 57, No. 2, pp. 95-99, 2010.
Wang et al., "Single-antenna Doppler radars using self and mutual injection locking for vital sign detection with random body movement cancellation", IEEE Transactions on Microwave Theory and Techniques, vol. 59, No. 12, pp. 3577-3587, 2011.
Yang et al., "Wearable RFID-enabled sensor nodes for biomedical applications", 58th Electronic Components and Technology Conference, 2008, pp. 2156-2159.
Yeager et al., "A 9 μA, Addressable Gen2 Sensor Tag for Biosignal Acquisition", IEEE Journal of Solid-State Circuits, vol. 45, No. 10, pp. 2198-2209, 2010.
International Preliminary Report on Patentability for International Application PCT/US2022/081201, Report issued Jun. 5, 2024, Mailed on Jun. 20, 2024, 8 Pgs.
International Search Report and Written Opinion for International Application No. PCT/US2022/081201, Search completed Feb. 14, 2023, Mailed Mar. 15, 2023, 13 Pgs.
Öjefors et al., "Active 220- and 325-GHz Frequency Multiplier Chains in an SiGe HBT Technology", IEEE Transactions on Microwave Theory and Techniques, vol. 59, Issue 5, May 2011, pp. 1311-1318, DOI: 10.1109/TMTT.2011.2114364.
Saeidi et al., "29.9 A 4x4 Distributed Multi-Layer Oscillator Network for Harmonic Injection and THz Beamforming with 14dBm EIRP at 416GHz in a Lensless 65nm CMOS IC", 2020 IEEE International Solid-State Circuits Conference, Aug. 2020, pp. 456-458.
Lin et al., "A 128.24-to-137.00GHz injection-locked frequency divider in 65nm CMOS", 2009 IEEE International Solid-State Circuits Conference, Digest of Technical Papers, 2009, pp. 282-283, Abstract.
Lin et al., "Analysis and Design of D-Band Injection-Locked Frequency Dividers", IEEE Journal of Solid-State Circuits, vol. 46, No. 6, pp. 1250-1264, 2011, Abstract.
Razavi, "A Millimeter-Wave Circuit Technique", IEEE Journal of Solid State Circuits, vol. 43, No. 9, pp. 2090-2098, 2008, Abstract.
Razavian et al., "A Highly Power Efficient 2x3 PIN-Diode-Based Intercoupled THz Radiating Array at 425GHz with 18.1dBm EIRP in 90nm SiGe BiCMOS", 2022 IEEE International Solid-State Circuits Conference, Conference Date: Feb. 20-26, 2022, San Francisco, California, 3 pgs.
Razavian et al., "Silicon Integrated THz Comb Radiator and Receiver for Broadband Sensing and Imaging Applications", IEEE Transactions on Microwave Theory and Techniques, Aug. 2021, Abstract.
Ryan et al., "The Carrier-Storage Frequency Divider: A Steady-State Analysis", IEEE Transactions on Circuit Theory, vol. 11, No. 3, pp. 396-403, Sep. 1964, doi: 10.1109/TCT.1964.1082318, Abstract.
Thomas et al., "A 0.4-4 THz p-i-n Diode Frequency Multiplier in 90-nm SiGe BiCMOS", IEEE Journal of Solid-State Circuits, vol. 58, No. 9, pp. 2407-2420, Sep. 2023, doi:10.1109/JSSC.2023.3289129.
Vogelsang et al., "A Static Frequency Divider up to 163 GHz in SiGe-BiCMOS Technology", 2022 IEEE BiCMOS and Compound Semiconductor Integrated Circuits and Technology Symposium (BCICTS), Oct. 16-19, 2022, pp. 49-52, Abstract.
Lin et al., "A 128.24-to-137.00GHz injection-locked frequency divider in 65nm CMOS", 2009 IEEE International Solid-State Circuits Conference, Digest of Technical Papers, 2009, pp. 282-283.
Lin et al., "Analysis and Design of D-Band Injection-Locked Frequency Dividers", IEEE Journal of Solid-State Circuits, vol. 46, No. 6, pp. 1250-1264, 2011.
Razavi, "A Millimeter-Wave Circuit Technique", IEEE Journal of Solid State Circuits, vol. 43, No. 9, pp. 2090-2098, 2008.
Razavian et al., "Silicon Integrated THz Comb Radiator and Receiver for Broadband Sensing and Imaging Applications", IEEE Transactions on Microwave Theory and Techniques, Aug. 2021.
Ryan et al., "The Carrier-Storage Frequency Divider: A Steady-State Analysis", IEEE Transactions on Circuit Theory, vol. 11, No. 3, pp. 396-403, Sep. 1964, doi: 10.1109/TCT.1964.1082318.
Vogelsang et al., "A Static Frequency Divider up to 163 GHz in SiGe-BiCMOS Technology", 2022 IEEE BiCMOS and Compound Semiconductor Integrated Circuits and Technology Symposium (BCICTS), Oct. 16-19, 2022, pp. 49-52.

\* cited by examiner

Table 1. Comparison With Prior Works

| Performance | This work | [1] | [6] | [3] |
|---|---|---|---|---|
| Highest frequency measured | 1.1 THz | 1.1 THz | 110 GHz | 214 GHz |
| Pulse width (FWHM) | 1.7 ps | 1.9 ps | 26 ps | 2.6 ps‡ |
| Repetition rate | 50 MHz to 10.5 GHz | 50 MHz to 5.5 GHz | 1.364 GHz to 1.519 GHz | N/A |
| Pulse generation technique | D2I† | D2I* | Oscillator-based | Oscillator-based |
| Die Area (mm²) | 0.48 | 0.47 | 6.16 | 2.5 |
| Power consumption | 25 mW | 105 mW | 1400 mW | N/A |
| Technology | 130-nm SiGe BiCMOS | 130-nm SiGe BiCMOS | 130-nm SiGe BiCMOS | 65-nm CMOS |

† Digital-to-Impulse architecture based on PIN diode reverse recovery
* Digital-to-Impulse architecture based on switching of a BJT
‡ Simulated result

FIG. 10

THz IMPULSE AND FREQUENCY COMB GENERATION USING REVERSE RECOVERY OF PIN DIODE

CROSS REFERENCE TO RELATED APPLICATIONS

The current application is a national stage of PCT Patent Application No. PCT/US2020/039800 entitled "THz Impulse and Frequency Comb Generation Using Reverse Recovery of PIN Diode" filed Jun. 26, 2020, which claims the benefit of U.S. Provisional Patent Application No. 62/866,954 entitled "THz Impulse and Frequency Comb Generation Using Reverse Recovery of PIN Diode" filed Jun. 26, 2019, the disclosures of which are hereby incorporated by reference in their entirety for all purposes.

STATEMENT OF FEDERALLY SPONSORED RESEARCH

This invention was made with government support under Grant Number 1830123, awarded by the National Science Foundation. The government has certain rights in the invention.

FIELD OF THE INVENTION

The present invention generally relates to fully integrated oscillator-less THz pulse radiators based on reverse recovery of a PIN diodes and to fully integrated frequency comb receivers for broadband sensing and imaging applications in millimeter-wave and THz bands.

BACKGROUND

In recent years, broadband pulse generation techniques have been of great interest in the terahertz (THz) and mm-wave research due to wide range of applications, such as high-speed communication, high-resolution radars, spectroscopy, and remote sensing, among others. Although different approaches and techniques have been proposed in recent years, increasing the bandwidth and radiation power in THz systems remains challenging due to the limitations of silicon-based technologies.

BRIEF SUMMARY OF THE INVENTION

Many embodiments provide a frequency-comb radiator based on reverse recovery of a PIN diodes. In an embodiment, a frequency-comb radiator includes a PIN diode, an on-chip antenna that radiates pulses, and a driver stage switched by a series of buffers.

In a further embodiment, the frequency-comb radiator further includes a hemispherical, high-impedance silicon lens placed under the on-chip antenna.

In a yet further embodiment, the frequency-comb radiator is implemented using a silicon-based technology.

In still a further embodiment, the frequency-comb radiator radiates a wideband frequency comb in the THz regime through the on-chip antenna.

In yet a further embodiment still, a spacing between THz tones is programmed by tuning a frequency of an input trigger.

In yet a further embodiment again, the frequency-comb radiator further includes a non-linear Q-Switching Impedance (NLQSI) circuit for tuning at least one of the amplitude and phase of the frequency tones.

In still a further embodiment again, the on-chip antenna is a coplanar waveguide-fed (CWP) slot bow-tie antenna.

In a further embodiment again, a reverse-recovery of the PIN diode is used to generate THz-pulses that are radiated through the on-chip antenna.

In a further embodiment again, the driver-stage is switched by a series of edge-sharpening inverting buffers.

In an embodiment, a frequency comb receiver includes: a PIN diode; a THz pulse generator block that generates THz tones (LO) for coherent frequency comb detection; an on-chip antenna for broadband detection; and a driver stage switched by a series of buffers.

In still a further embodiment, a repetition rate of the LO tones are tunable over a range and determines a spacing between two adjacent tones in the corresponding frequency comb.

In still a further embodiment again, the frequency comb receiver further includes a single diode-connected bipolar junction transistor (BJT) that mixes RF and LO signals, where the RF signal is received via the on-chip antenna.

In still a further embodiment again, the on-chip antenna is a broadband slot-bowtie antenna.

In yet a further embodiment again, the frequency-comb receiver is implemented using a silicon-based technology.

In yet a further embodiment again, a repetition rate of the LO tones is locked to a trigger signal generated by an ultra-low-phase noise external source.

In yet a further embodiment again, the frequency comb receiver is used to characterize another identical chip in pulse radiating mode.

BRIEF DESCRIPTION OF THE DRAWINGS

FIG. 10 illustrates a comparison a THz pulse radiator with prior works in accordance with an embodiment of the invention.

DETAILED DESCRIPTION OF THE DRAWINGS

Figure 1:
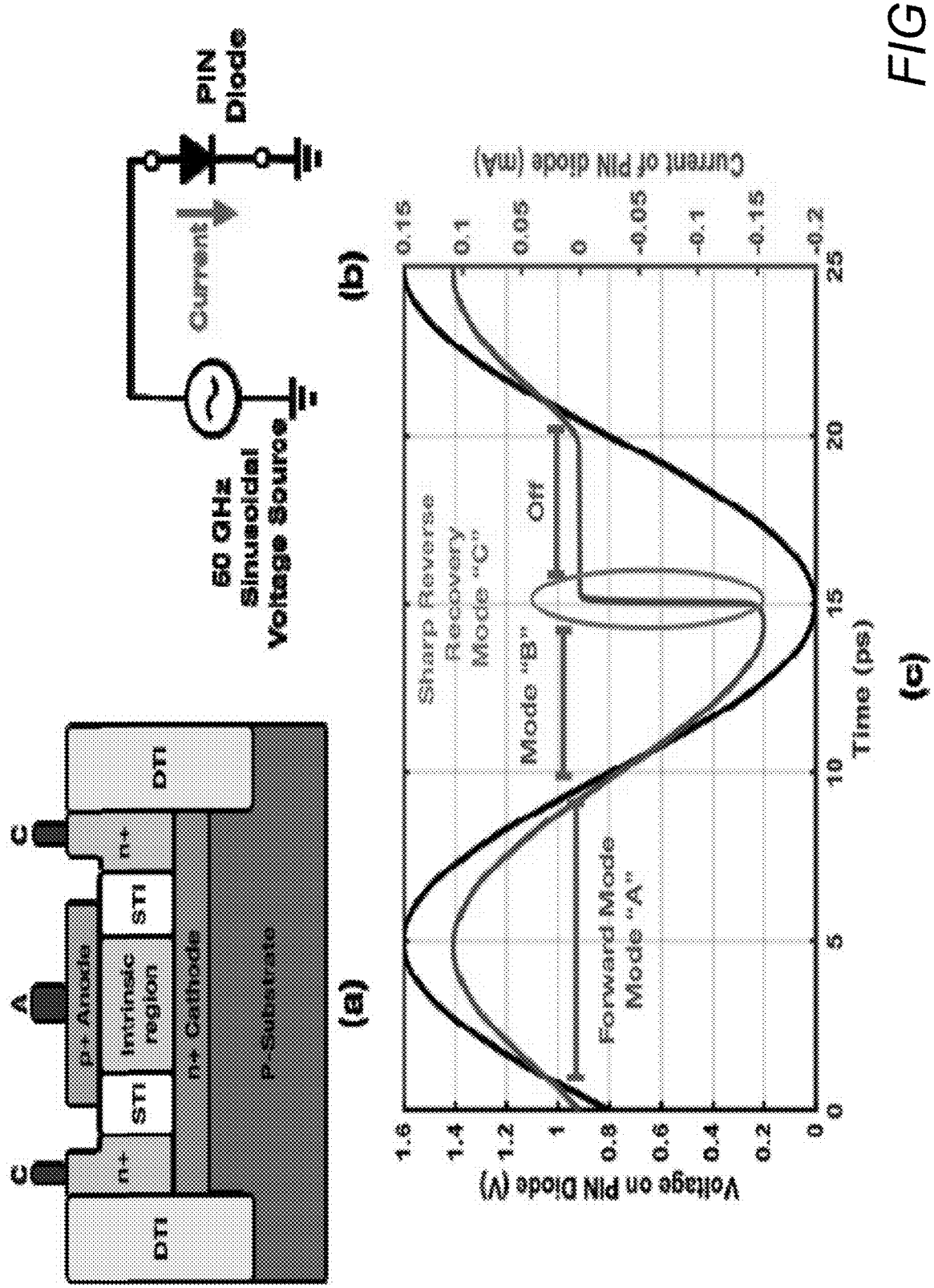
FIG. 1 illustrates a structure of a PIN diode device in the SiGe 130-nm BiCMOS process, a test-circuit illustrating the sharp reverse recovery of a PIN diode, and voltage and current waveforms of a PIN diode in different regions of operation in accordance with an embodiment of the invention.

Turning now to the drawings, THz pulse radiators based on reverse recovery of PIN diodes in accordance with embodiments of the invention are illustrated. Many embodiments provide a fully integrated oscillator-less THz pulse radiator based on reverse recovery of a PIN diode. In many embodiments, the pulse radiator can be implemented using 130-nm SiGe BiCMOS technology. In certain embodiments, the chip may radiate a wideband frequency comb in the THz regime through an on-chip antenna. In many embodiments, the on-chip antenna is a coplanar waveguide-fed (CPW) slot bow-tie antenna. In many embodiments, the spacing between the THz tones can be programmed (e.g., up to 10.5 GHz) by tuning the frequency of the input trigger. The spectrum of the radiated frequency comb may be measured from, for example, 320 GHz to 1.1 THz with 5.5-GHz spacing between the tones. In certain embodiments, a Non-Linear Q-Switching Impedance (NLQSI) technique can be used for tuning the frequency tones and increasing the stability of the output stage. In many embodiments, the frequency-comb radiator can include a driver stage that mimics the role of a 50-GHz source, and the driver stage can be switched by a series of edge-sharpening inverting buffers.

In certain embodiments, at a distance of for example 4 cm from the pulse radiator, the measured SNRs (including the losses) with 1 Hz resolution bandwidth are 51, 40, and 21 dB at 0.6, 0.8, and 1 THz, respectively with a 10-dB line-width of less than 2 Hz. In several embodiments, with a 5.5-GHz input trigger, the total power consumption of the chip is 55 mW, with 25 mW consumed by the driver stage.

Many embodiments provide for a fully integrated oscillator-less frequency comb receiver for broadband sensing, spectroscopy, and imaging in millimeter-wave and THz bands. In many embodiments, the frequency comb receiver chip includes a THz pulse generator block to generate the reference tones for coherent frequency comb detection. In many embodiments, the repetition rate of the reference pulses (LO frequency comb) may be tunable over a 4-10.5 GHz range. A broadband on-chip antenna with a peak directivity of 15 dBi can be employed for broadband detection.

Most of the prior works in broadband pulse generation have been based on the fast switching speed of transistors. For instance, by switching a bipolar transistor in a very short interval (on/off keying approach), pulses with full width at half maximum (FWHM) of 1.9 ps have been achieved. Wideband frequency comb generation may also be possible by switching a THz continuous wave (CW) radiator; however, the bandwidth of the generated frequency comb can be limited by the switching speed of the transistors. Dynamic pulse generation by controlling the phase and amplitude of the harmonic frequencies may also be utilized for pulse generation, however, programming the phase and amplitude of tones at mm-wave/THz frequencies may require complex circuit blocks. Likewise, Step-Recovery-Diodes (SRD) may be popular for harmonic generation and frequency multipliers due to their ultra-sharp reverse recovery. However, SRDs may not be available in silicon processes. PIN diodes in accordance with various embodiments exhibit similar reverse recovery behavior to SRDs, and thus can enable efficient harmonic generation.

Accordingly, many embodiments of the THz radiator include a PIN diode and use the reverse-recovery of the PIN diode to generate THz-pulses (wideband frequency comb), which can be radiated through a wideband on-chip antenna. Accordingly, many embodiments provide a PIN diode-based THz pulse radiator implemented in a silicon-based process.

Design Procedure

A structure of a PIN diode in 130-nm SiGe BiCMOS process in accordance with an embodiment of the invention is shown in FIG. 1. To illustrate a sharp reverse recovery of a PIN diode, many embodiments consider the special case in which an ideal 50-GHz sinusoidal voltage source can be applied across a PIN diode. Because a PIN diode can be a nonlinear time-variant component, its operation can be divided into three separate intervals, as shown in FIG. 1C in accordance with an embodiment of the invention. In mode "A," the diode is in forward mode, and holes and electrons may be injected from N and P regions into the I-region. The amount of stored charge in the I-region may depend on the carrier lifetime ($\tau$) and amount of forward current. As the voltage across the diode drops, the current may start flowing in the reverse direction (region "B"), thus, depleting the excess charge stored in the I-region. When the I-region is fully depleted (mode "C"), the reverse current may drop to zero with a time-constant determined by series cathode resistance ($R_{CX}$), off-state capacitance, and the impedance of the circuit driving the PIN diode. Therefore, many embodiments specify an optimum size of the PIN diode which may be important to achieve the shortest time constant. The sharp change in the current can generate THz tones at the load if proper matching is used. In many embodiments, the PIN diode is driven with a large voltage swing at a certain frequency range in order to have a fast reverse recovery. At frequencies below 20 GHz (e.g., frequency of the damping oscillation at node X), the amount of reverse current may not be large enough to generate high-power THz tones. On the other hand, at high frequencies (e.g., above 100 GHz), the I-region may not be fully depleted in each period; thus, the diode may not enter the highly nonlinear reverse region. Although FIG. 1 illustrates a particular structure of a PIN diode device, any of a variety of structures may be utilized as appropriate to the requirements of specific applications in accordance with embodiments of the invention.

Figure 3:
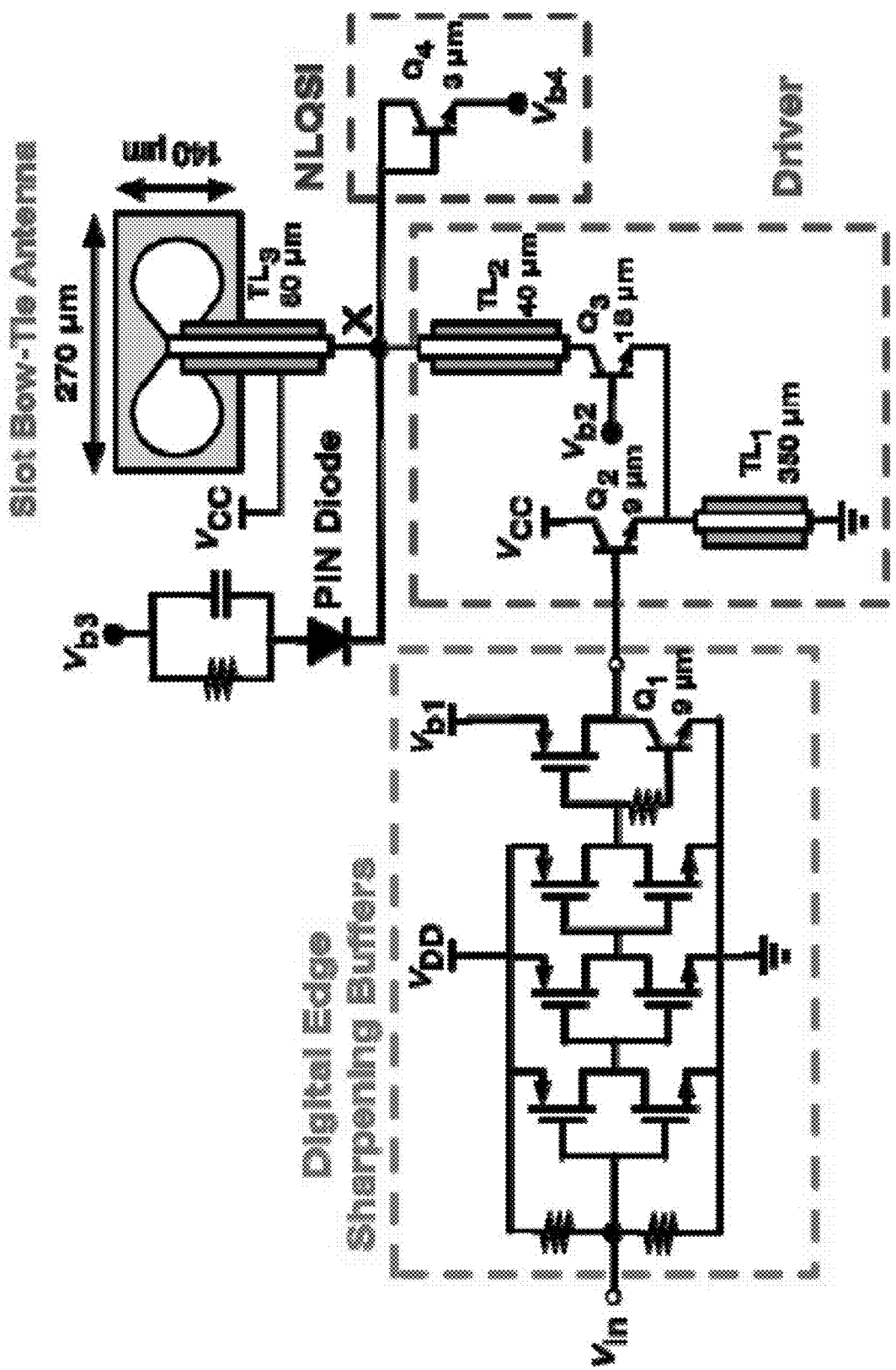
FIG. 3 illustrates a circuit schematic of a frequency-comb radiator in accordance with an embodiment of the invention.

An architecture of a broadband THz pulse radiator in accordance with an embodiment of the invention is illustrated in FIG. 3. The operation of the blocks that may be used in the architecture of a THz pulse radiator in accordance with various embodiments of the invention are discussed in detail below.

Driver

Figure 2:
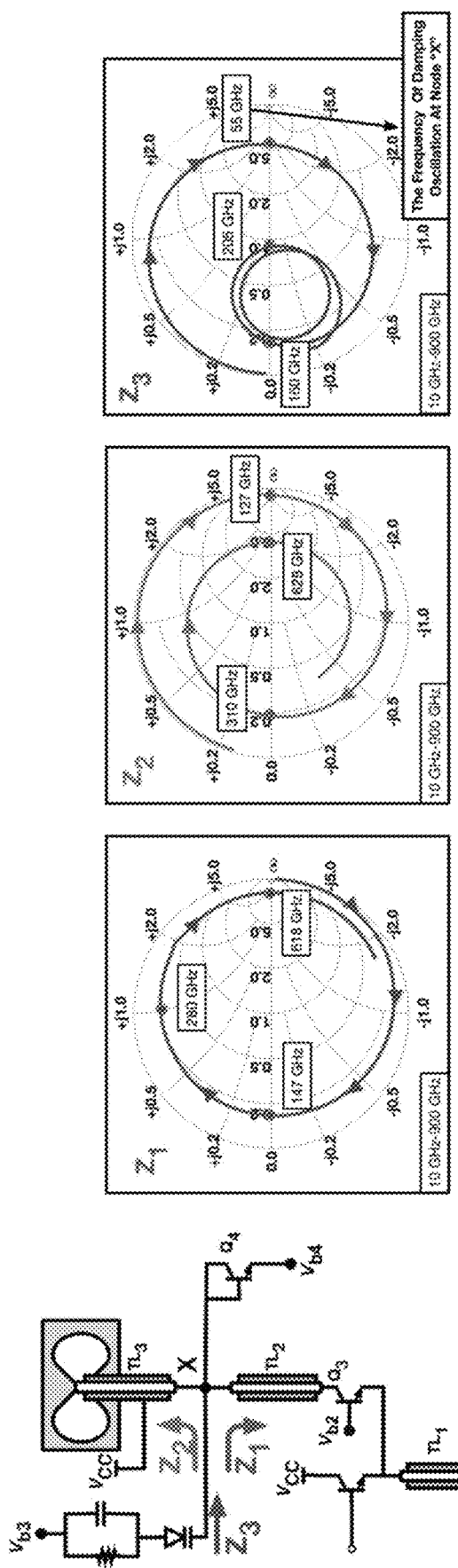
FIG. 2 illustrates a Smith chart of the impedances at node X for broadband matching analysis in accordance with an embodiment of the invention.

To push a PIN diode to the highly-nonlinear region, a custom driver stage may be used. FIG. 3 illustrates a custom driver stage that can mimic the role of the 50-GHz source described above in accordance with an embodiment of the invention. In several embodiments, the driver stage can be switched by a series of edge-sharpening inverting buffers that are functional at frequencies as high as 10.5 GHz. Depending on the voltage level at the output of the digital buffers, the operation of the driver can be investigated in two separate intervals. In certain embodiments, when the output of the digital buffers is high, the driver stage can be turned on. During this interval, the current flowing through the TL1 may rise and the stored energy in TL1 can increase. The amount of the current flowing through TL1 can be adjusted by tuning $V_{b1}$. In the second interval, driver ($Q_2$) can be switched off abruptly via the inverting buffer ($Q_1$). In order to lower the transition time of the switching, an NPN BJT can be used instead of an NMOS transistor in the last stage of the inverting buffers. Due to the abrupt switching of Q2, Q3 can be turned on and the current flows through it. Consequently, a large ringing may be generated at node X, which can cause the PIN diode to operate in a highly-nonlinear region. Proper wideband matching may be important in order to radiate the generated broadband pulses efficiently. To illustrated the driver performance, the impedance at node X can be analyzed as illustrated in FIG. 2 in accordance with an embodiment of the invention. The effects of parasitics are included in the analysis with the aid of EM simulations and PDK models. The length and width of the TL2 may be optimized so that the impedance seen from node X toward TL2 ($Z_1$) is sufficiently larger than the impedance seen toward TL3 ($Z_3$) over the frequency band of the radiation, as illustrated in FIG. 2 in accordance with various embodiments of the invention. At the frequency of the damping oscillation at node X, TL2 can be neglected due to its short length. Without TL2, most of the generated THz power may be absorbed by the parasitic capacitors of $Q_3$. Moreover, the length of the TL3 may be tuned for a flat frequency-comb radiation over a wide band. In certain embodiments, the total impedance seen at node X may show a strong resonance around a particular frequency (e.g., 55 GHz), which may be the frequency of the damping oscillation that drives the PIN diode into the nonlinear region. Although FIG. 3 illustrates a particular circuit schematic of a frequency-comb radiator, any of a variety of circuit architectures may be utilized as appropriate to the requirements of specific applications in accordance with embodiments of the invention.

Non-Linear Q Switching Impedance

In several embodiments, the abrupt switching of Q2 may cause a large damping oscillation at node X. Accordingly, the frequency of the damping oscillation may depend on poles and zeroes associated with node X rather than the frequency of the input trigger. As a result, the PIN diode may enter the sharp reverse recovery region more than once in a period due to the oscillation at node X; therefore, unsynchronized pulses may be generated. This effect may cause undesired nulls and peaks in the frequency spectrum of the radiated signal. In many embodiments, the NLQSI approach may be utilized to prevent nulls and peaks in the frequency spectrum. In certain embodiments, Q4 may begin conduction, when voltage at node X reaches a certain threshold. Consequently, the Q-factor may be reduced, and the oscillation may be damped at a faster rate. As a result, the PIN diode may be pushed into the sharp reverse recovery region (e.g., highly nonlinear region) once in a period. Moreover, due to large current switching at the driver stage, the circuit can be prone to undamped oscillation. In certain embodiments, $Q_4$ may provide that the circuit remains stable by decreasing the Q-factor in the case of an oscillation.

Broadband On-Chip Antenna

At mm-wave/THz frequencies, off-chip antennas may not be suitable due to the long, lossy, inductive interconnects (e.g., wire-bonds, PCB traces, among various others). Yet, on-chip antennas can be integrated in proximity to the other blocks of the circuits, thus benefiting from a larger bandwidth and higher efficiency. In various embodiments, for broadband radiation, a custom-designed coplanar waveguide-fed (CPW) slot bow-tie antenna may be used. For simulation purposes, the input impedance of the antenna may be simulated over the desired frequency range and modeled using lumped components for circuit simulations.

Radiation efficiency of on-chip antennas may be poor in the bulk processes, since a large portion of the radiation may get trapped in the lossy silicon substrate (in the form of substrate modes). Accordingly, in many embodiments, a hemispherical, high-impedance silicon lens can be placed under the chip, which substantially improves the bandwidth and radiation efficiency of the antenna by eliminating the substrate modes.

Chip Characterization

Figure 4:
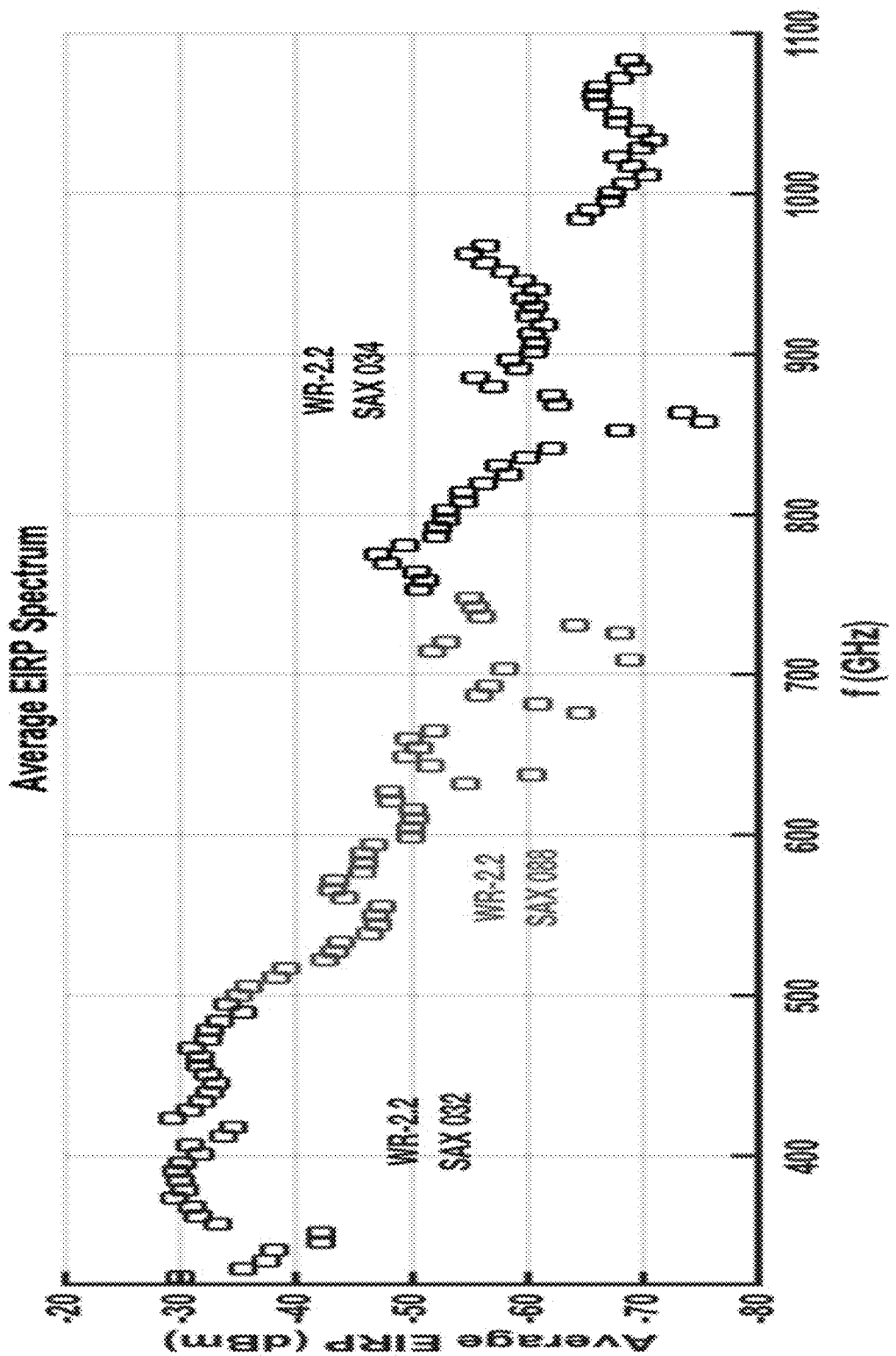
FIG. 4 illustrates calculated average EIRP based on the measurement results in accordance with an embodiment of the invention.
Figure 5:
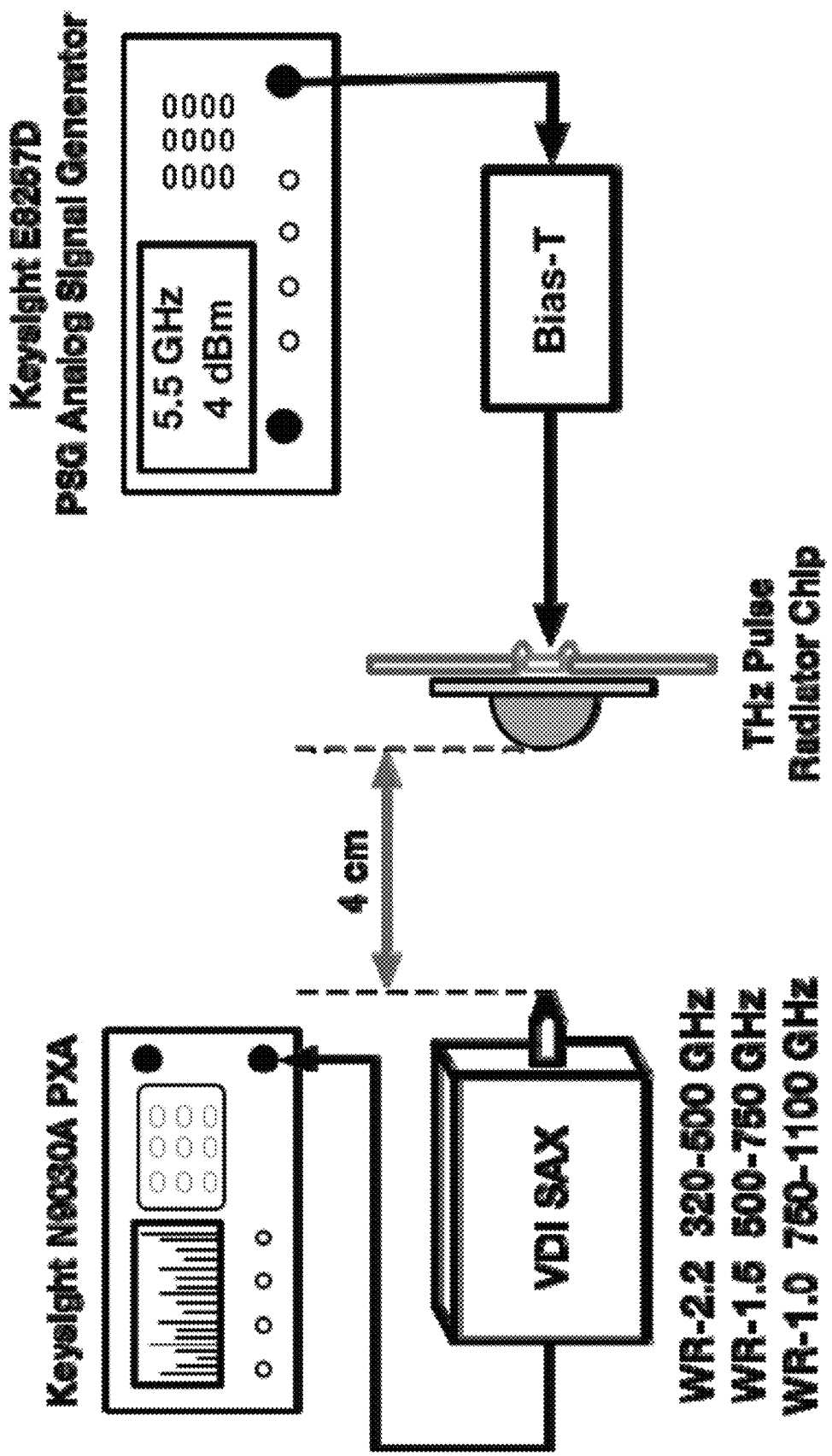
FIG. 5 illustrates a setup for the measurement of the EIRP in accordance with an embodiment of the invention.
Figure 6:
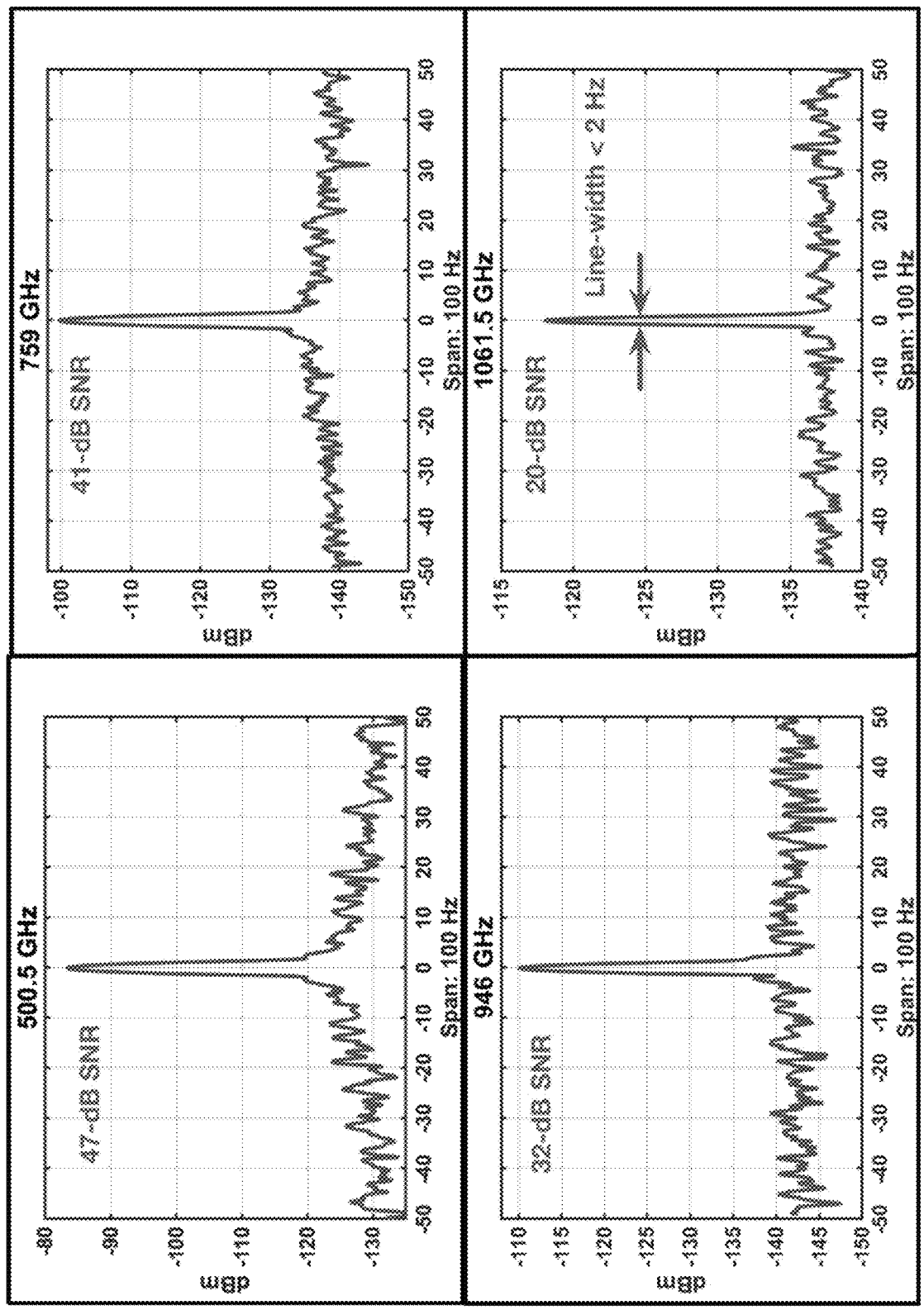
FIG. 6 illustrates measured THz tones of radiated frequency comb in accordance with an embodiment of the invention.

A setup for chip characterization in the frequency domain in accordance with an embodiment of the invention is illustrated in FIG. 5. Based on the dimensions of the antenna and the silicon lens, to ensure a far-field mode of radiation, the receiver antenna may be placed at a 4-cm distance from the chip for frequencies above 320 GHz. Virginia Diodes spectrum analyzer extenders (VDI SAX) for three separate bands may be used for obtaining the spectrum of the received signal from 320 GHz up to 1.1 THz. The average effective isotropic-radiated power (EIRP) illustrated in FIG. 4 can be calculated for each frequency point based on the Friis transmission formula and the EM simulation of antenna. For EIRP calculations, the loss of the cables, antenna loss, VDI SAX IF amplification, and mixer conversion loss (e.g., using the VDI SAX calibration test data for each frequency point) can be calibrated. As illustrated in FIG. 4, there may be some sharp fluctuations in several regions of the spectrum, which may stem from different factors, including nulls due to the silicon lens, EIRP measurement error, and VDI SAX calibration test data error for each band. In addition, the raw tones (e.g., embedded loss) on the spectrum analyzer in accordance with an embodiment of the invention are illustrated in FIG. 6. Although FIG. 5 illustrates a particular setup for chip characterization in the frequency domain, any of a variety of setups can be utilized as appropriate to the requirements of specific applications in accordance with embodiments of the invention.

Figure 7:
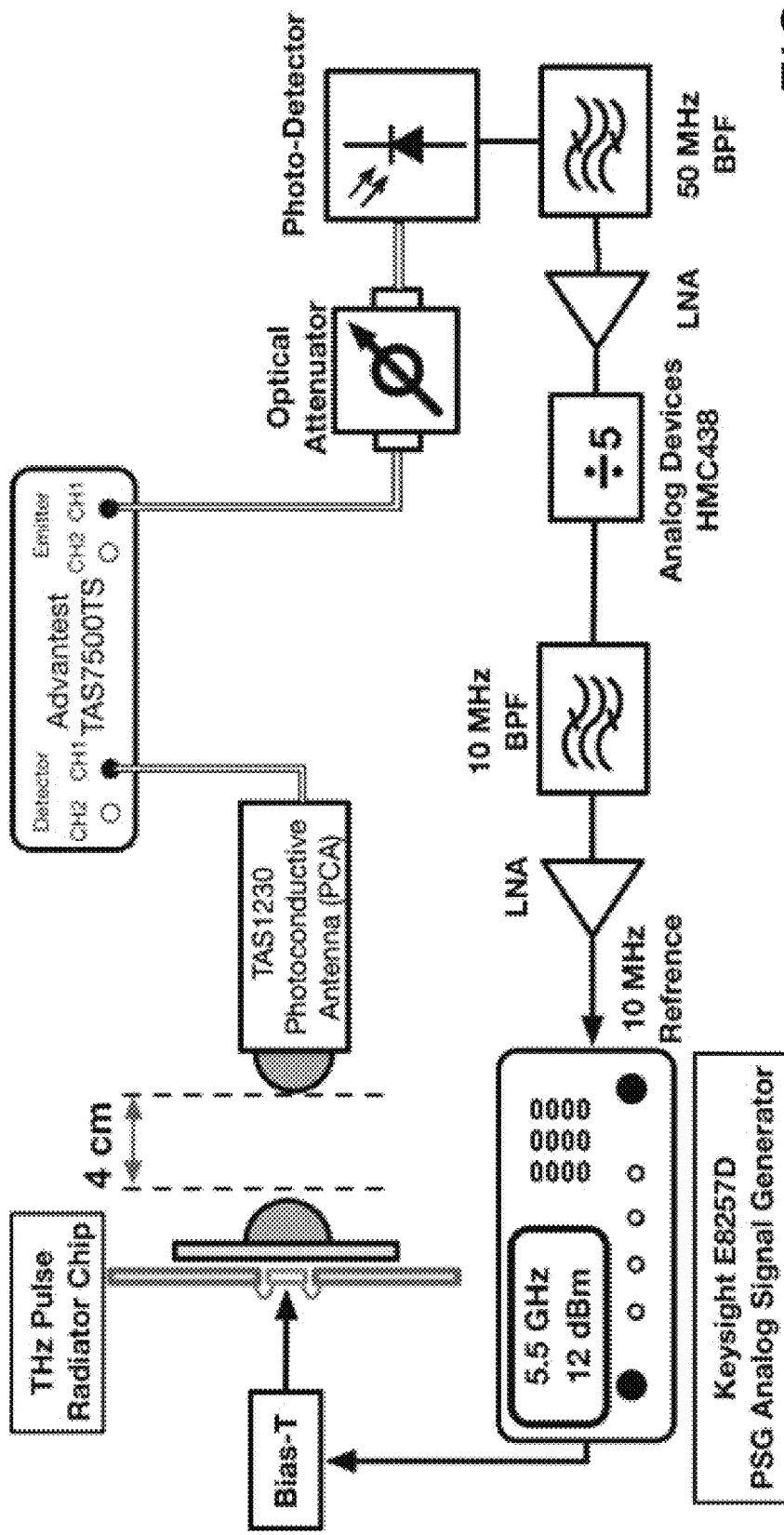
FIG. 7 illustrates a time-domain measurement setup in accordance with an embodiment of the invention.
Figure 8:
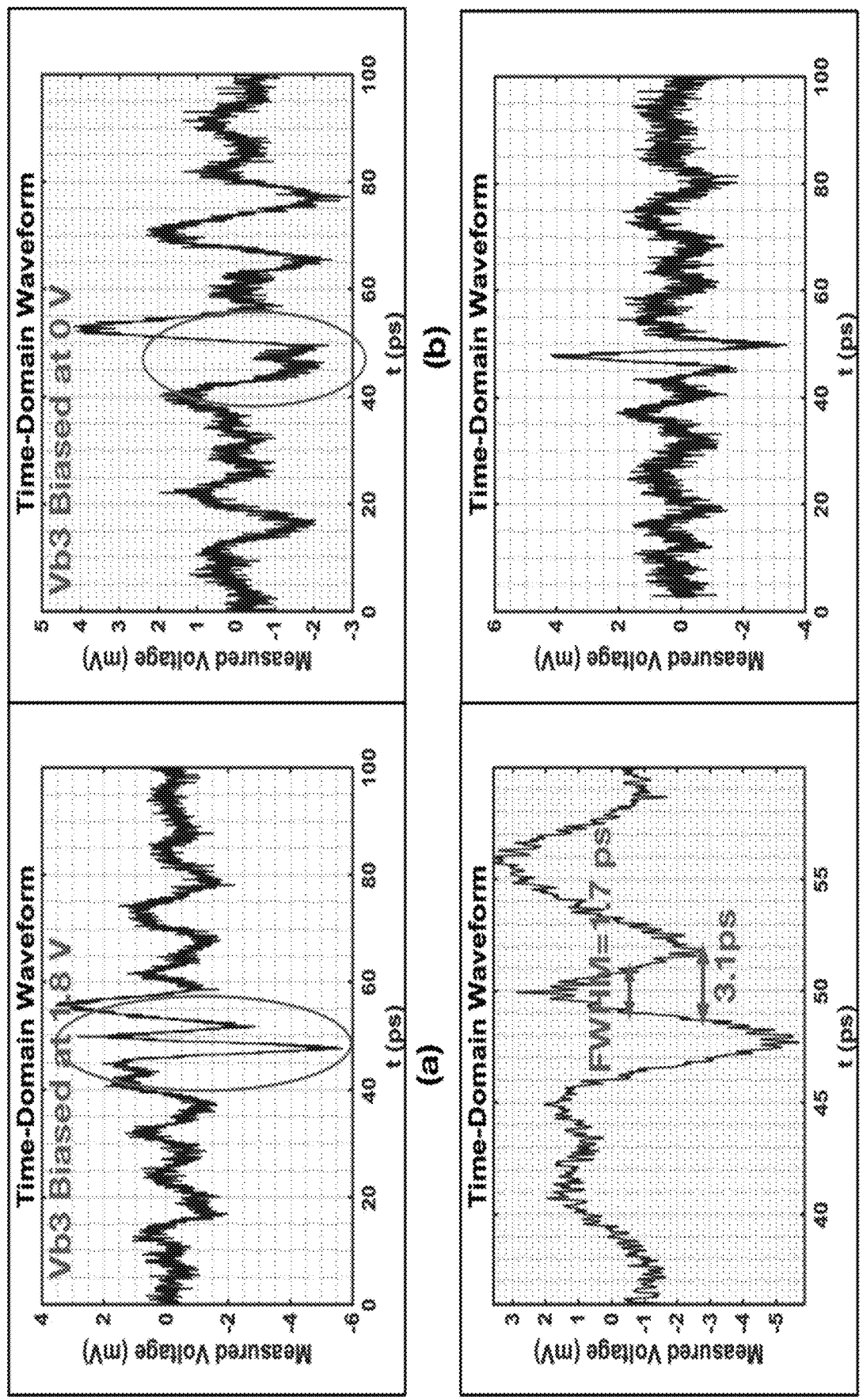
FIG. 8 illustrates a time-domain waveforms of a radiated pulse, the PIN diode is biased at 1.8 v, (b) PIN diode is biased off; (c) Zoomed version of (a); (d) Subtraction of (b) and (a) in accordance with an embodiment of the invention.

Due to the limited bandwidth of the electronic oscilloscopes, the time-domain measurement of the radiated waveform may be difficult to perform. On the other hand, optical THz-TDS systems can provide a large bandwidth for capturing the wideband waveforms. In order to perform time-domain measurement, certain embodiments may utilize a setup as illustrated in FIG. 7 in accordance with various embodiments of the invention that utilizes an Advantest TAS7500TS femtosecond-laser-based THz sampling system. Note that the input trigger of the chip may need to be locked to the THz-TDS system; otherwise, due to the frequency drift of the input trigger, the signal may disappear during averaging due to significant jitters. To address this issue, in several embodiments, the signal generator can be locked to the THz-TDS system using the approach demonstrated in FIG. 7 in accordance with various embodiments of the invention. The resultant time-domain waveform of the radiated pulse after an averaging number of 256 is illustrated in FIG. 8 in accordance with an embodiment of the invention, which shows a FWHM of 1.7 ps.

Figure 9:
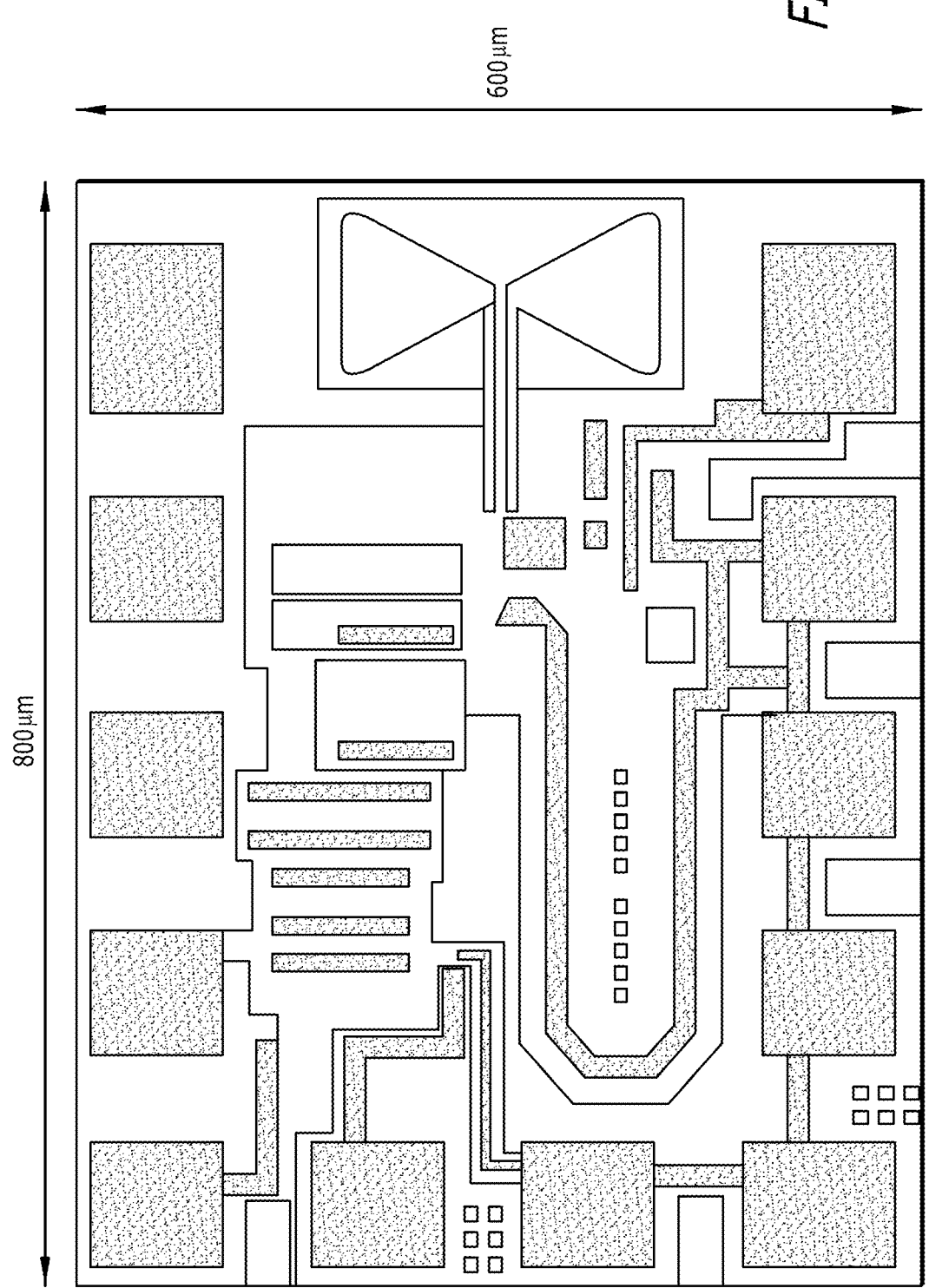
FIG. 9 illustrates a THz pulse radiator die photograph in accordance with an embodiment of the invention.

Accordingly, many embodiments provide a fully integrated on-chip THz pulse radiator based on reverse recovery of a PIN diode. In various embodiments, the repetition rate of the generated pulses may be programmable using the input trigger, which can be tuned to as high as 10.5 GHz in certain embodiments. In certain embodiments, the power consumption of the driver stage can be 25 mW at 5.5 GHz repetition-rate. In several embodiments, an on-chip slot bow-tie antenna can be employed for radiating the THz pulses with an efficiency above 60% over the band of radiation. The spectrum of the radiated pulses can be measured from 320 GHz up to 1.1 THz using the VDI SAX and the Keysight N9030A PXA signal analyzer. Table 1 illustrated in FIG. 10 shows the comparison between certain embodiments of the invention and prior works. Based on FIG. 4, certain embodiments of the invention demonstrate higher radiation power at frequencies above 300 GHz, a flatter average ERIP spectrum, and lower power consumption compared to the state of the art. A micrograph of a fabricated chip in accordance with an embodiment of the invention is illustrated in FIG. 9. Although FIG. 9 illustrates a particular micrograph of a fabricated chip, any of a variety of chip architectures may be utilized as appropriate to the requirements of specific applications in accordance with embodiments of the invention. Many embodiments provide for frequency comb receivers, which are described in detail below.

A Fully Integrated Coherent 50-500-GHz Frequency Comb Receiver for Broadband Sensing and Imaging Applications Many embodiments provide a fully integrated oscillator-less coherent frequency comb receiver. In particular, a challenge in developing electronic THz systems has been the limited maximum oscillation frequency (fmax) of the transistors. Accordingly, many embodiments provide for power generation above fmax by driving the transistors and diodes into a highly nonlinear region. In many embodiments, THz tones (LO), generated by a broadband pulse generator block, and the received THz signals are mixed by a single diode-connected bipolar junction transistor (BJT). As a result, the frequency comb in mm-wave/THz is mapped into low-frequency IF band. The low-frequency IF can be analyzed using inexpensive electronic equipment. Accordingly, the dual-comb scheme and techniques for pulse generation provide for enhanced sensitivity, reduction in power consumption, and improvement of bandwidth. Moreover, in many embodiments, the frequency-comb LO can decrease the time of spectral scanning significantly, which can be used for ultra-fast spectroscopic applications.

Described in detail below are principles of coherent frequency comb detection and the pulse generation techniques in accordance with various embodiments of the invention.

Principles of Coherent Comb-Based Receiver

Theoretical Analysis

Figure 12:
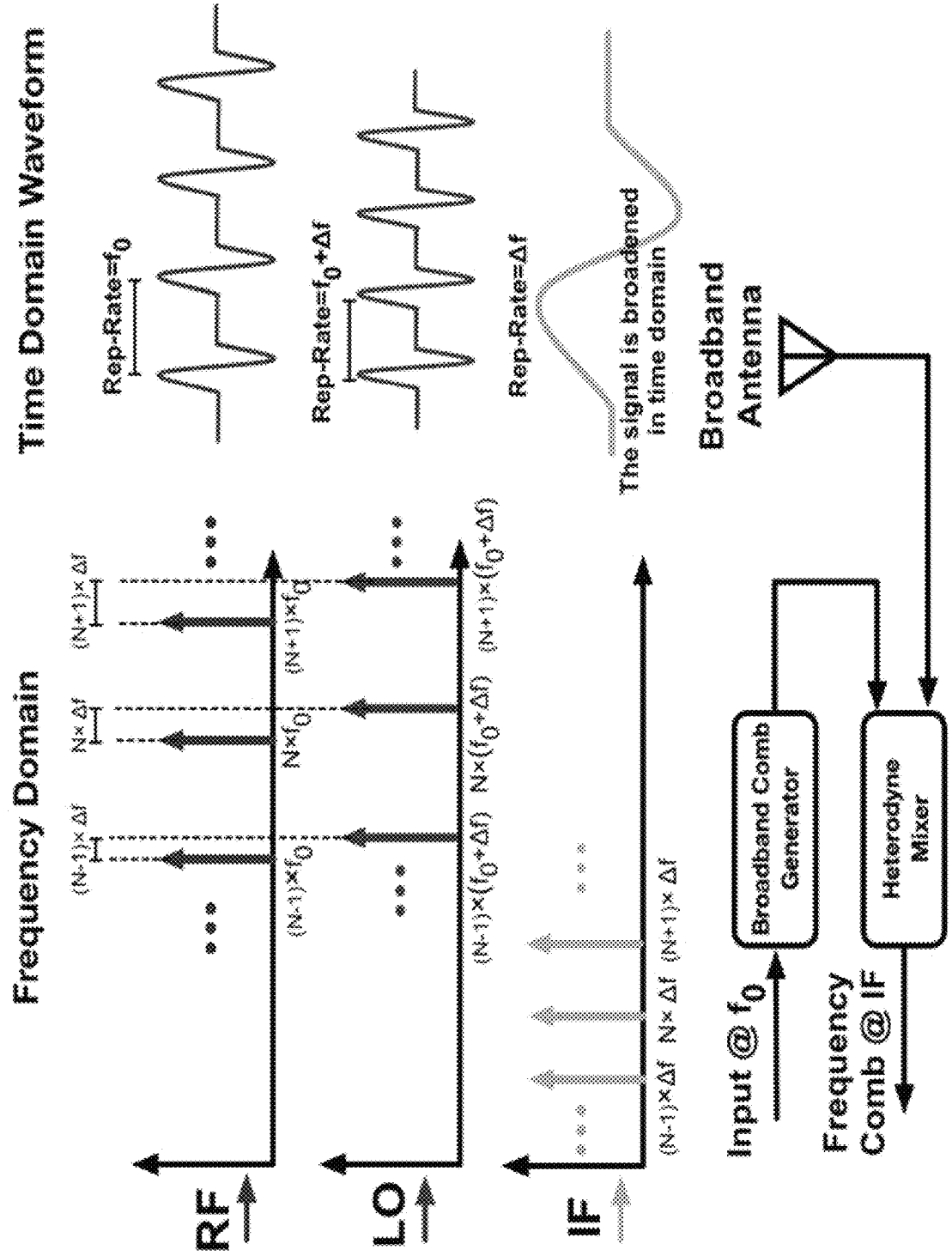
FIG. 12 illustrates a frequency comb detection technique in accordance with an embodiment of the invention.

In a pulse-based system, the repetition rate (rep-rate) of the pulses determines the spacing between the two adjacent tones in the corresponding frequency comb. Consequently, by changing the repetition rate of the pulses, the spacing between the tones can be tuned. The concept behind the comb-based detector is illustrated in FIG. 12 in accordance with an embodiment of the invention. This is similar to the concept of the dual-comb technique for spectroscopic applications in optics where a small frequency difference is applied between repetition rates of transmitted optical pulses and sampling receiver. This results in two frequency combs with a slight frequency difference between tones in the transmitter and receiver. Therefore, after mixing, a frequency comb in IF frequency that incorporates the information of RF spectrum can be obtained. The spacing between adjacent tones in IF frequency comb is $\Delta f$. The tunability feature of the pulse rep-rate is useful to detect arbitrary frequency combs with different spacing between tones. In many embodiments, the RF and LO signals are mixed using a single diode-connected BJT where the RF signal is received via a broadband slot-bowtie antenna.

In many embodiments, the receiver is also capable of detecting a CW signal. For CW detection, one of the tones in the reference frequency comb should be tuned to have a frequency close to the signal of interest. As a result, the desired received signal is downconverted to IF frequency by mixing with one of the tones in the reference frequency comb (LO).

Circuit Analysis

Figure 11:
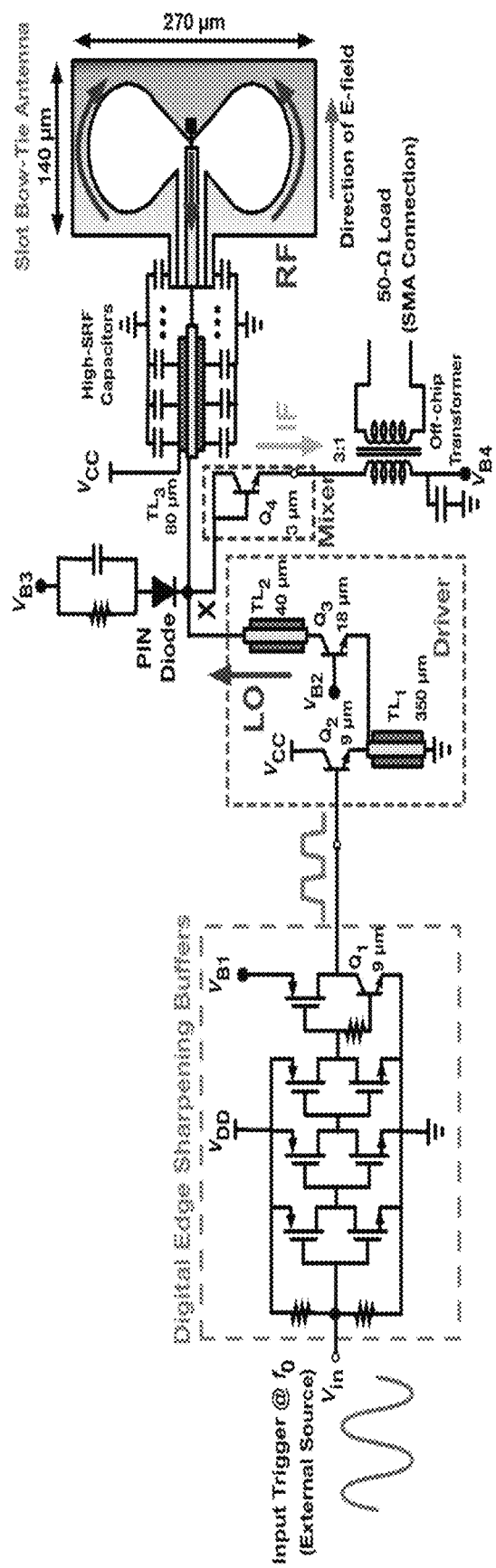
FIG. 11 illustrates a circuit schematic of a comb receiver in accordance with an embodiment of the invention.
Figure 13:
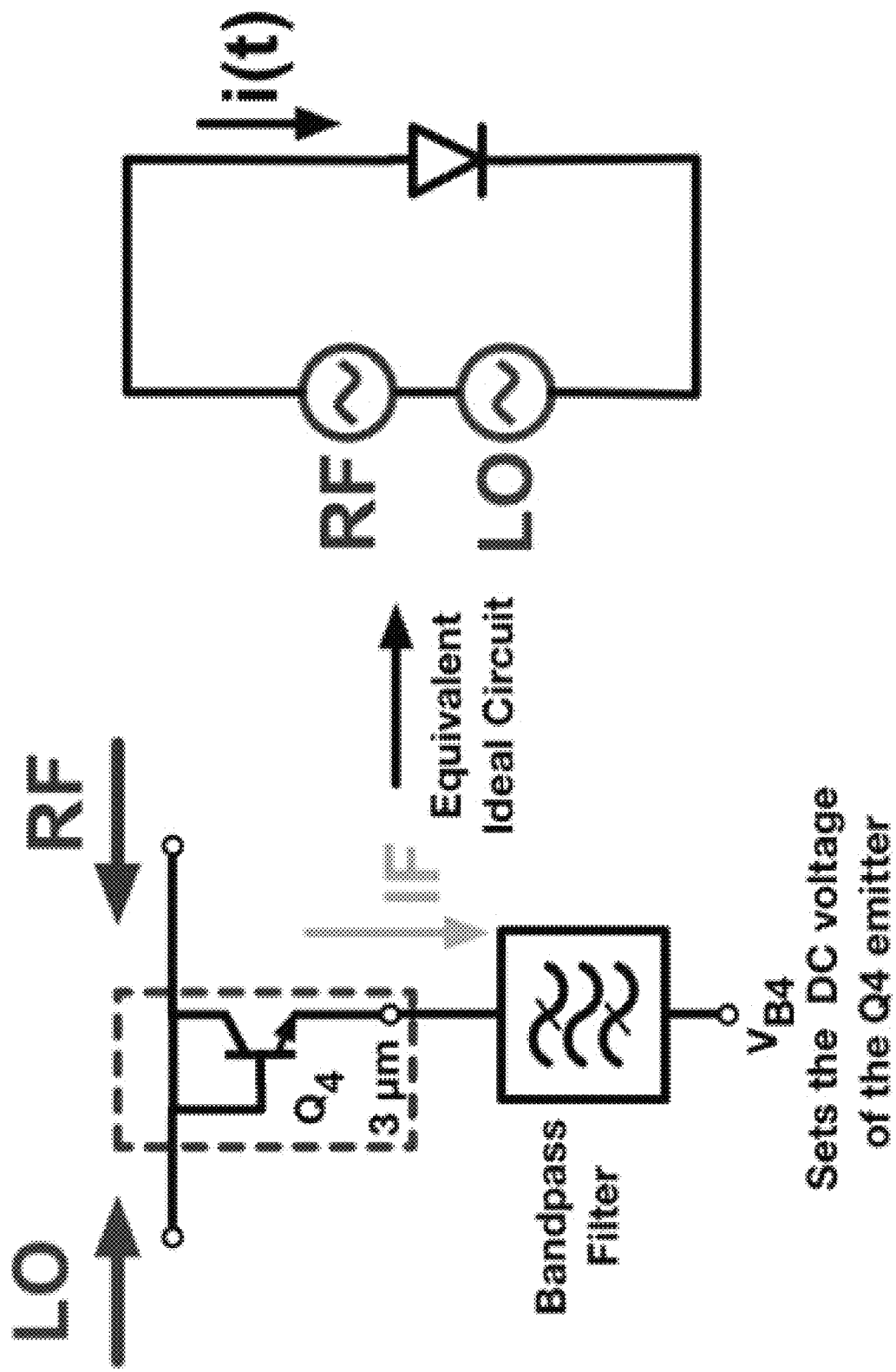
FIG. 13 illustrates a simplified model of the schematic to illustrate the mixing effect in accordance with an embodiment of the invention.

A schematic of a comb-based receiver in accordance with an embodiment of the invention is illustrated in FIG. 11. In order to generate a broadband LO frequency comb, many embodiments include a driver stage. In many embodiments, the design of the driver is similar to buck-boost converters where the energy stored in an inductor during the first time interval is released and delivered to the load in the second interval. Similarly, the performance of the driver can be divided into two separate stages. In the first interval, the driver is turned on, and Q2 begins conducting current from Vcc. Due to the inductive effect of T L1, the current keeps rising until it reaches a saturated level. In other words, during this stage, the energy is stored in T L1 in the form of current In the second interval, Q2 is switched off. Due to the inductance of T L1, the voltage at the emitter of Q2 drops (negative spike). Consequently, Q3 turns on, and the current, which was accumulated in T L1 during the first interval, starts flowing through Q3. In other words, the current of Q2 is accumulated and later delivered to Q3. This reuse of the current decreases the power consumption of the driver stage and increases the total DC-to-RF efficiency. The sudden current flow through the branch of Q3 generates a large signal across the passive mixer. Note that due to the non-linearity of Q3, the LO signal at node X is not a single tone, but rather a wide-band frequency comb. FIG. 13 illustrates how mixing is performed across Q4 in accordance with an embodiment of the invention. The downcoverted terms can be calculated using the following equation:

$$i(t)=I_0+G_m[vRF(t)+vLO(t)]+G'_m[vRF(t)+vLO(t)]^2+ \quad (1)$$

where Gm represents the Taylor series expansion terms of a BJT's current. Since the LO is a frequency comb rather than a single tone signal, when combined with RF across Q4, it generates a frequency comb at IF. A large part of the generated LO power can be radiated through the antenna in THz band, consequently, the chip can be utilized as a THz frequency comb radiator under different biasing.

In many embodiments, the received signal via the antenna combines with LO at node X, thereby modulating the current of the Q4. Accordingly, the current of Q4 contains the IF frequency comb. Since the IF frequency is low, an off-chip transformer with the ratio of 3:1 can be used to match the IF output to 50-$\Omega$ load and to maximize the power delivery. Although FIG. 11 illustrates a particular circuit schematic of a comb receiver, any of a variety of architectures can be utilized as appropriate to the requirements of specific applications in accordance with embodiments of the invention.

Chip Characterization

Frequency-Domain Measurement

Figure 14:
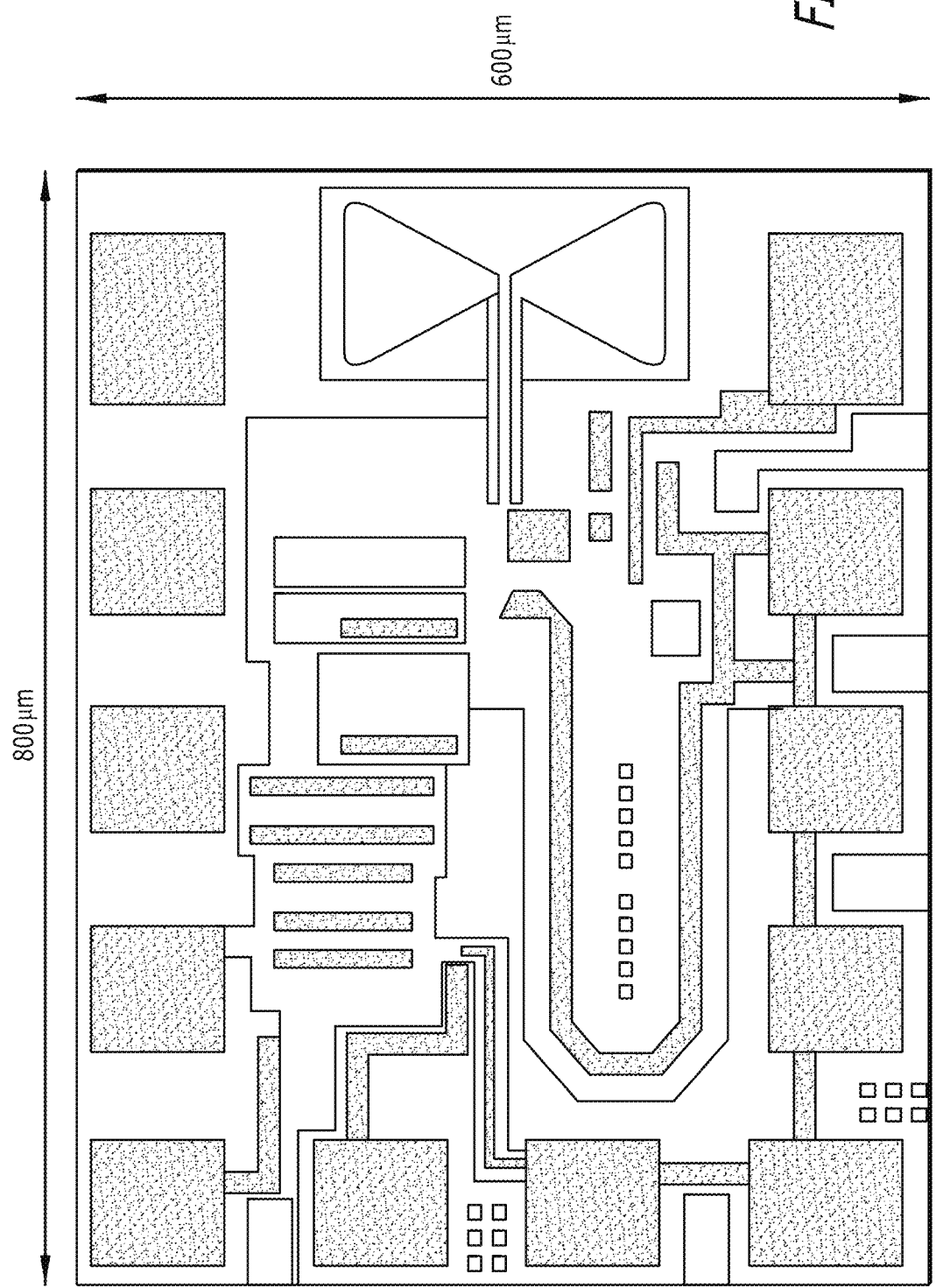
FIG. 14 illustrates a die photo of a frequency comb receiver in accordance with an embodiment of the invention.

A die photo of a chip in accordance with an embodiment of the invention is shown in FIG. 14. In many embodiments, in order to measure the response of the chip through the spectrum, CW sources in different bands can be used. Since the radiated power of the sources is known, by utilizing Friis transmission formula at far-field distance, the conversion loss of the receiver can be measured. Moreover, the sensitivity of the receiver can be derived from measuring the change in the noise floor on spectrum analyzer.

Figure 15:
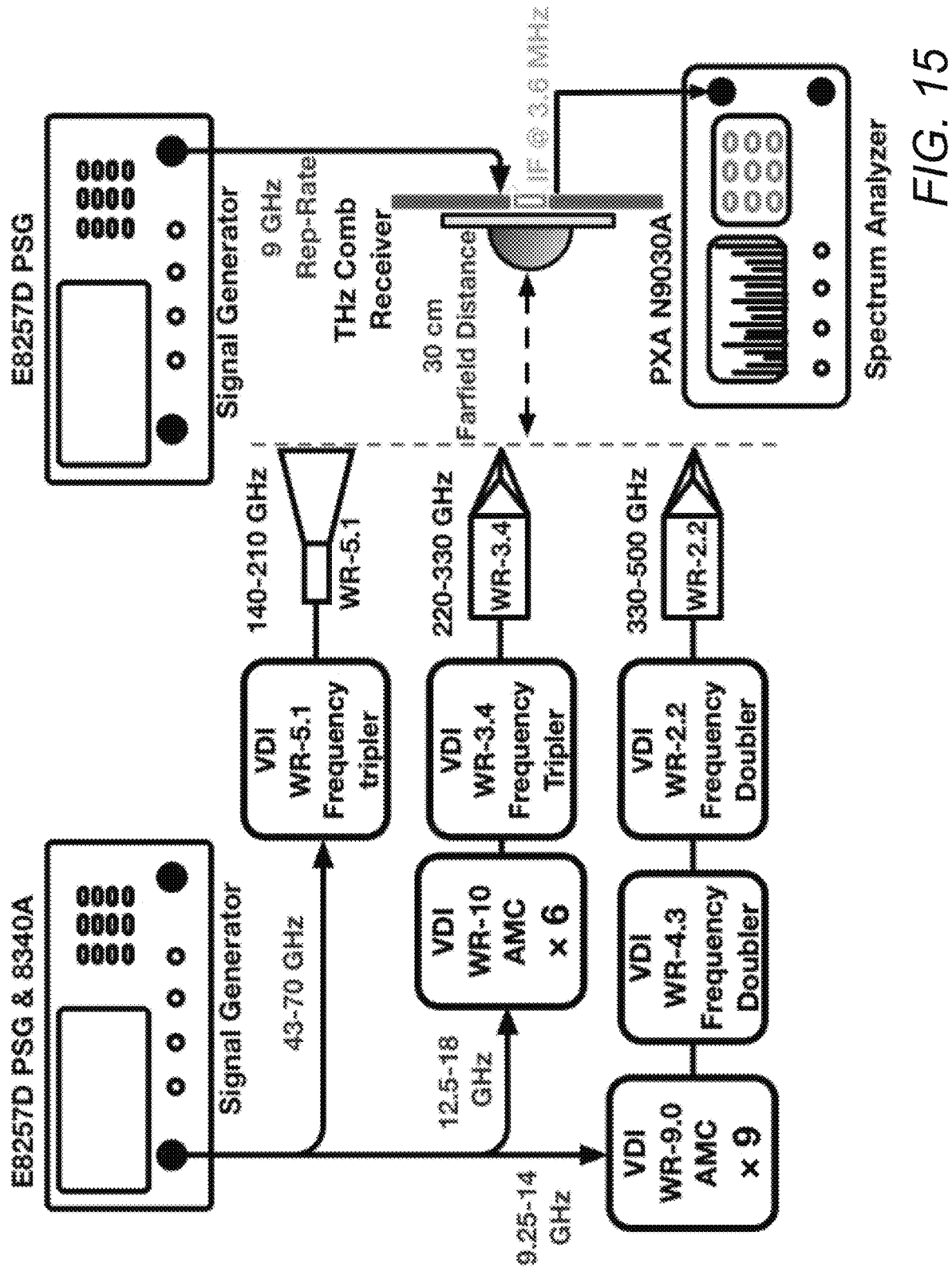
FIG. 15 illustrates a measurement setup to characterize the chip in frequency domain in accordance with an embodiment of the invention.
Figure 16:
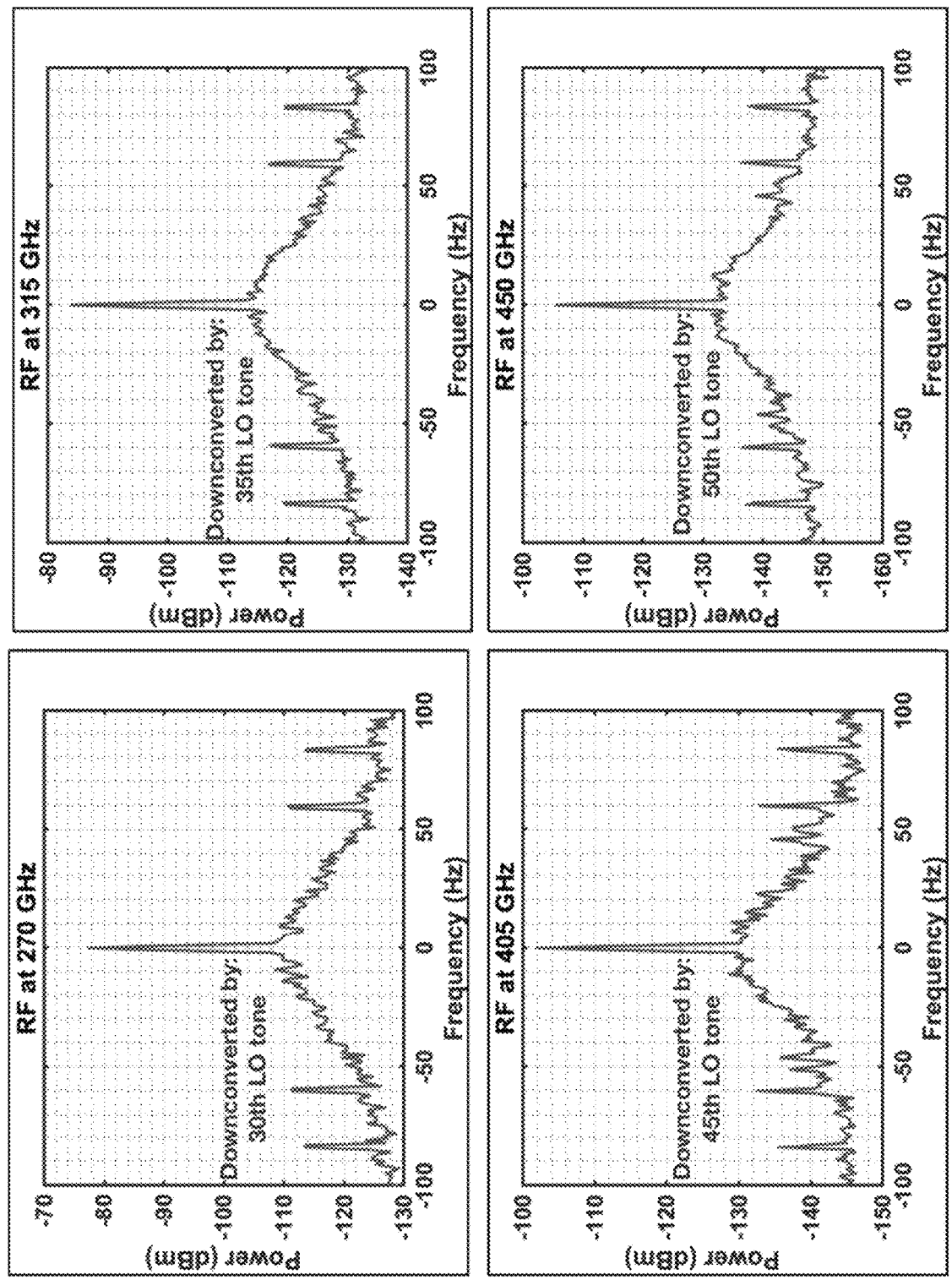
FIG. 16 illustrates downconverted THz tones at 3.6 MHz IF with 1-Hz RBW and 200-Hz span in accordance with an embodiment of the invention.

FIG. 15 illustrates a setup for frequency characterization of the chip from 140 GHz to 500 GHz in accordance with an embodiment of the invention. For CW power radiation, frequency multipliers can be driven via a 67-GHz Keysight signal generator (E8257D) and a 26-GHz HP signal generator (8340A). A WR-5.1 VDI tripler can be used for CW radiation from 140 GHz to 220 GHz. For 220-330-GHz band, a ×6 WR-10 AMC and a VDI WR-3.4 tripler can be utilized. Moreover, a VDI WR9.0 SGX module can be configured with external multipliers to extend the frequency coverage up to 500 GHz. For each band, the calibration test data provided by the manufacturer can be used to calibrate the received power. The measured IF tones of 4 RF frequencies with the resolution bandwidth (RBW) of 1 Hz are shown in FIG. 16 in accordance with an embodiment of the invention. The SSB-conversion loss (CL) and the sensitivity (for 1-kHz RBW) are measured and shown in FIG. 17 in accordance with an embodiment of the invention, defined by the following expressions:

$$CL_{|dB} = P_{R,ant|dBm} - P_{IF|dBm} \quad (2)$$

$$\text{Sensitivity} = 10 \log\left(\frac{1\text{ kHz}}{RBW}\right) + RX_{IF-noisefloor} + CL \quad (3)$$

Where $P_{R,ant}$ is defined as follows:

$$P_{R,ant|dBm} = P_{t|dBm} + G_{t|dBi} + G_{r|dBi} - L_{path|dB} \quad (4)$$

Figure 17:
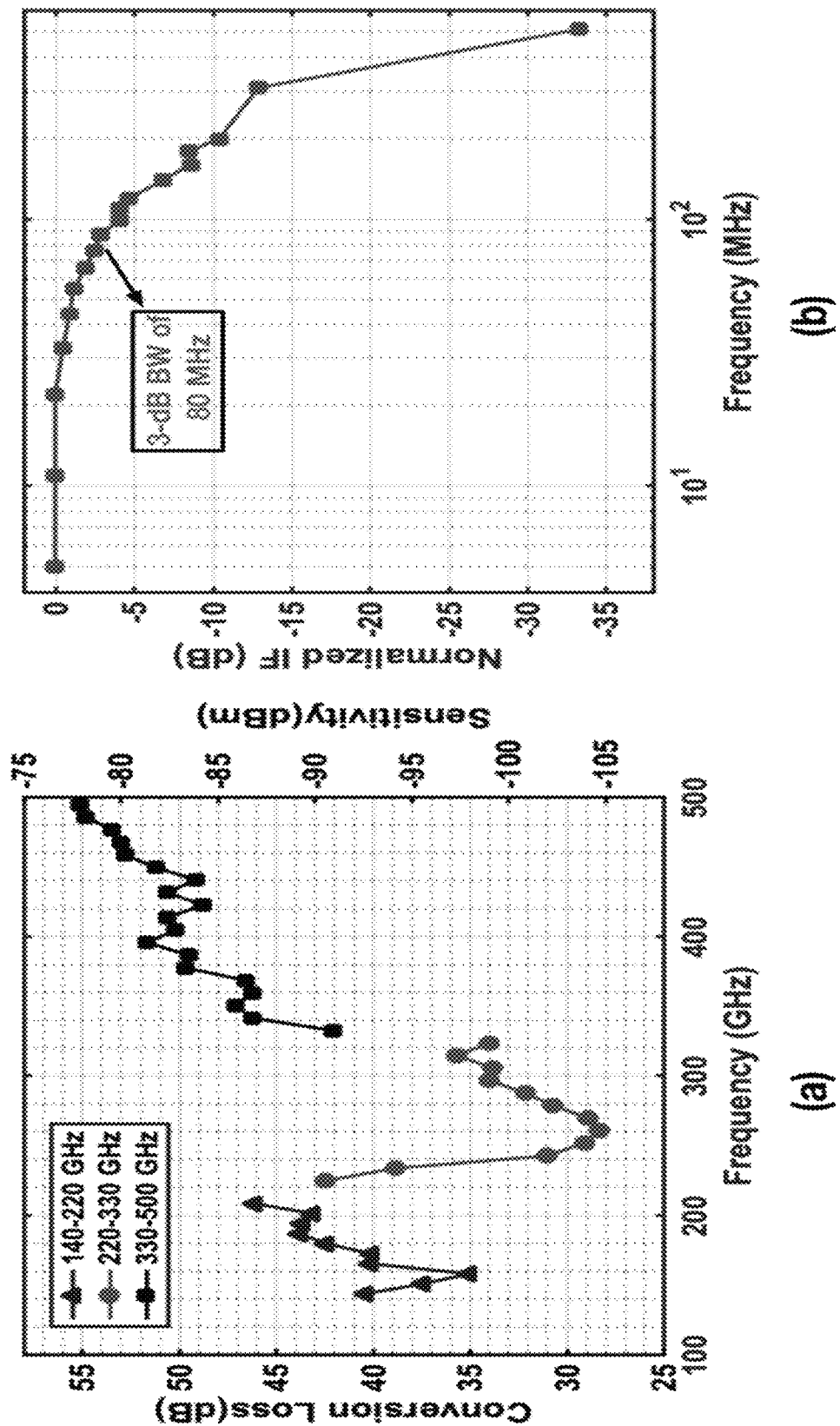
FIG. 17 illustrates a) conversion loss and sensitivity of a comb receiver and b) normalized IF power against IF frequency in accordance with an embodiment of the invention.

Note that the noise floor changes with IF frequency and biasing voltages but is not affected by RF frequency. In many embodiments, the measured average noise floor is −163 dBm at 3.6 MHz. To measure the IF bandwidth, specific RF tone can be selected, and IF frequency can be swept by adjusting the trigger frequency of the receiver. The normalized IF power versus frequency is shown in FIG. 17 in accordance with an embodiment of the invention. A features of such receivers is the spectral purity of the IF tones. This directly depends on the phase noise of the tones in the frequency comb. In many embodiments, the repetition rate of the pulses is locked to the trigger signal generated by an ultra-low-phase noise external source. However, phase noise deterioration due to the multiplication of the input trigger frequency may be inevitable. Neglecting the effect of noise sources in frequency multipliers, the amount of phase noise deterioration is given by:

$$L_{Nf0} = 20 \log(N) + L_{f0} \quad (5)$$

where N is the multiplication factor and $f_0$ is the fundamental frequency. Note that even with the phase noise deterioration due to frequency multiplication, tones with the 10-dB line-width of less than 2 Hz can be achieved. A phase noise of −82 dBc is achieved at 10-kHz offset frequency for a received tone at 333 GHz (9-GHz repetition rate).

Chip-to-Chip Measurement

Figure 18:
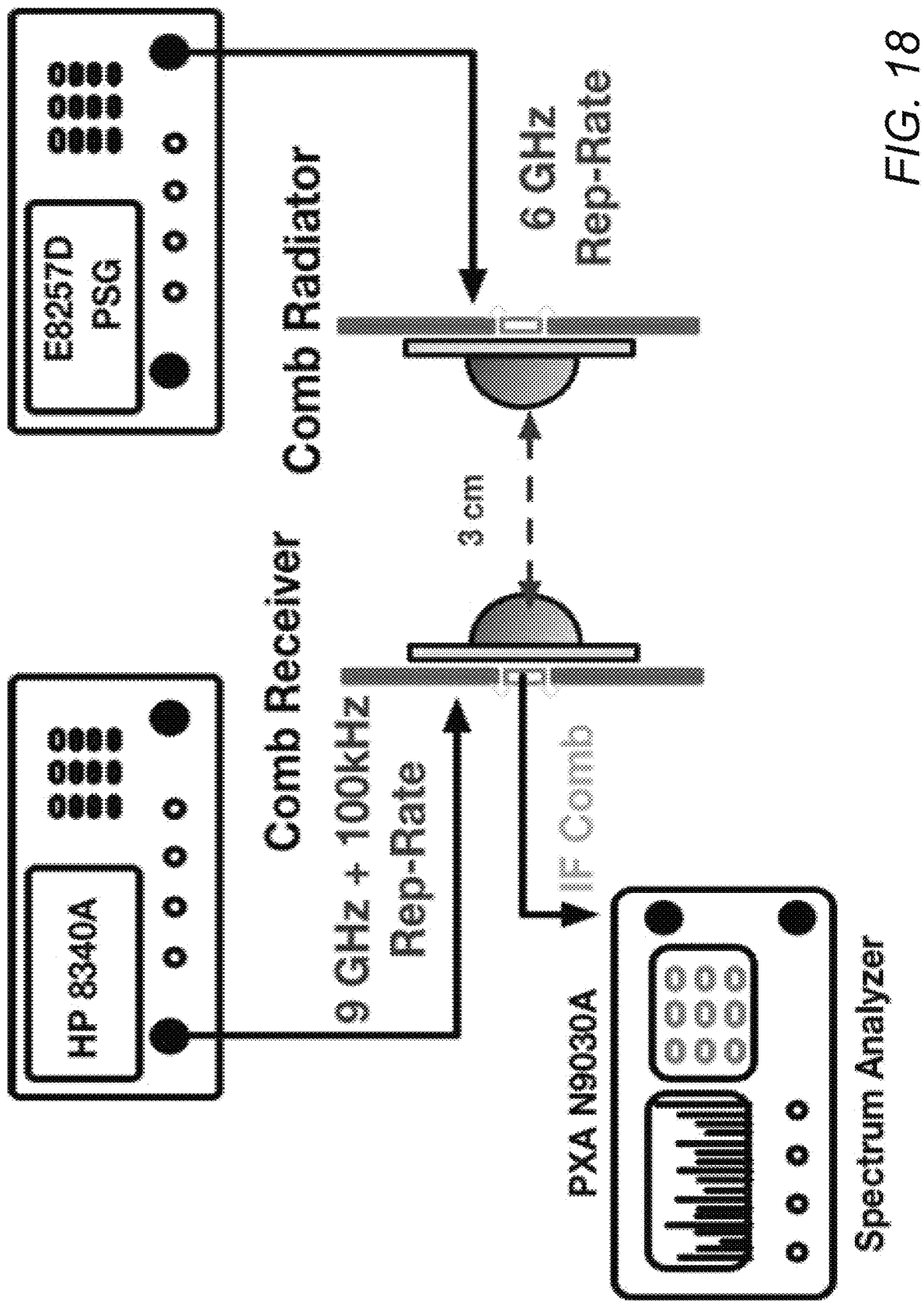
FIG. 18 illustrates a setup for chip-to-chip frequency-domain measurement in accordance with an embodiment of the invention.
Figure 19:
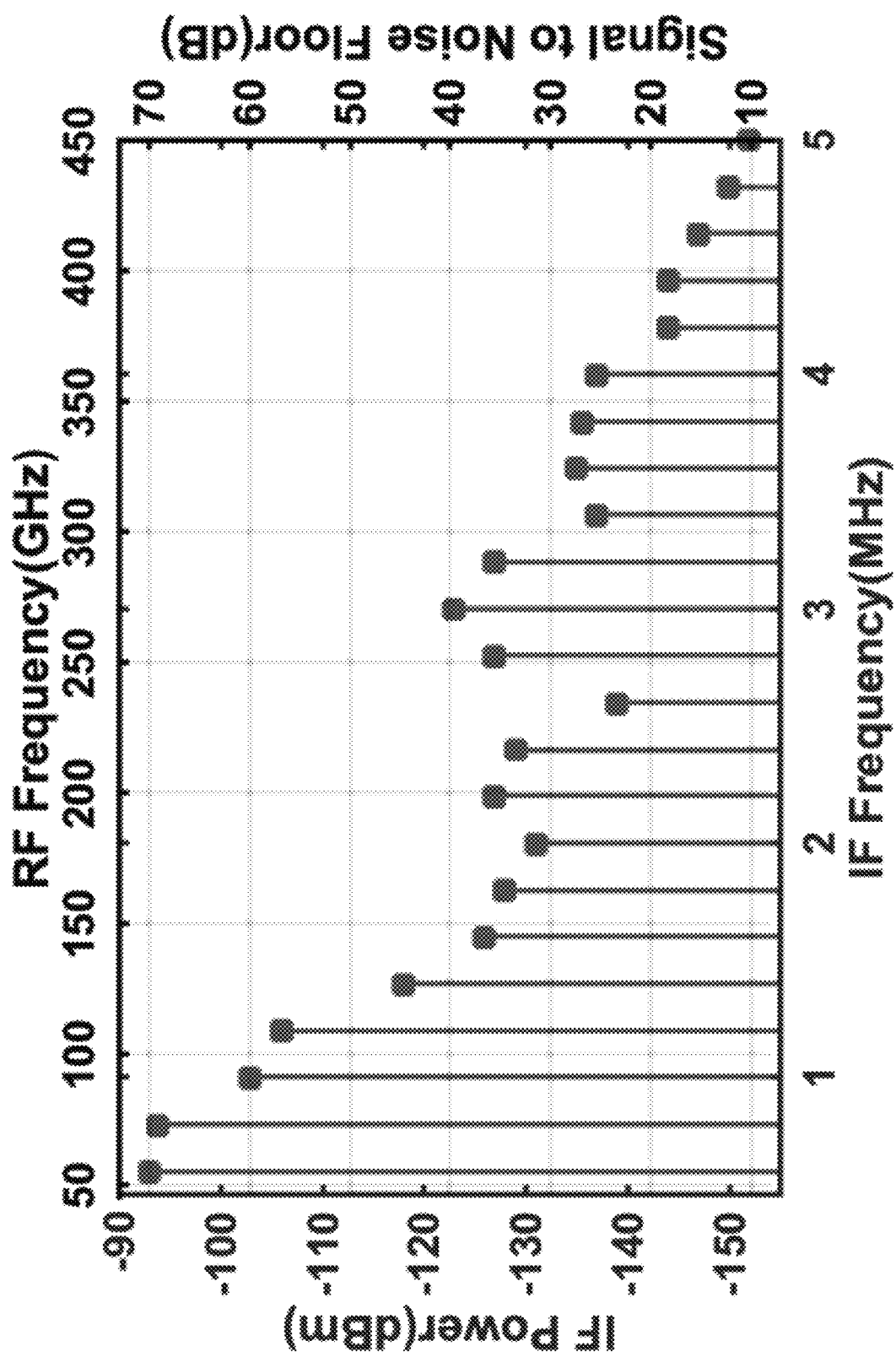
FIG. 19 illustrates achieved IF-comb power and signal to noise Floor (1-Hz RBW) for chip-to-chip comb measurement in accordance with an embodiment of the invention.

In this section, a chip in receiver mode may be used to characterize another identical chip in pulse radiating mode (under different biasing). FIG. 18 illustrates a measurement setup in accordance with an embodiment of the invention. The rep-rate (frequency comb spacing) of the transmitter and receiver can be set at 6 GHz and 9 GHz+100 kHz, respectively, which results in IF comb with tones at 600, 800, 1000 kHz, etc., that correspond to the RF frequencies of 54, 72, 90 GHz, etc., respectively with a maximum measured RF frequency of 450 GHz. FIG. 19 shows the IF-frequency-comb spectrum and the achieved signal to the noise floor seen on the spectrum analyzer (1-Hz RBW) in accordance with an embodiment of the invention.

Although specific implementations for a pulse radiator are discussed above with respect to FIGS. 1-19, any of a variety of implementations utilizing the above discussed techniques can be utilized for a pulse radiator and/or a comb receiver in accordance with embodiments of the invention. While the above description contains many specific embodiments of the invention, these should not be construed as limitations on the scope of the invention, but rather as an example of one embodiment thereof. It is therefore to be understood that the present invention may be practiced otherwise than specifically described, without departing from the scope and spirit of the present invention. Thus, embodiments of the present invention should be considered in all respects as illustrative and not restrictive.

What is claimed is:

1. A frequency-comb radiator, comprising:
   a PIN (positive, intrinsic, negative) diode;
   an on-chip antenna that radiates pulses, wherein the PIN diode is coupled to the on-chip antenna through a matching network; and
   a driver stage switched by an input signal through a series of buffers, the driver stage comprising a first transistor and a first transmission line, where the first transmission line is connected to an end side of the PIN diode and to the first transistor, and the first transmission line isolates the PIN diode from the first transistor;
   wherein a reverse-recovery of the PIN diode caused by the switching of the driver stage is used to generate Terahertz (THz) pulses that are radiated through the on-chip antenna; and
   wherein the combination of the transistor and transmission line in the driver stage causes the PIN diode to operate in a nonlinear region and the nonlinearity of the PIN diode generates the THz-pulses that are radiated through the on-chip antenna through the matching network.

2. The frequency-comb radiator of claim 1, further comprising a hemispherical, high-impedance silicon lens placed under the on-chip antenna.

3. The frequency-comb radiator of claim 1, wherein the frequency-comb radiator is implemented using a silicon-based technology.

4. The frequency-comb radiator of claim 1, wherein the frequency-comb radiator radiates a wideband frequency comb in the THz regime through the on-chip antenna.

5. The frequency-comb radiator of claim 4, wherein a spacing between THz tones is programmed by tuning a frequency of an input trigger.

6. The frequency-comb radiator of claim 1, further comprising a non-linear Q-Switching Impedance (NLQSI) circuit for tuning at least one of amplitude and phase of the frequency tones.

7. The frequency-comb radiator of claim 1, wherein the on-chip antenna is a coplanar waveguide-fed (CPW) slot bow-tie antenna.

8. The frequency-comb radiator of claim 1, wherein the driver stage is switched by a series of edge-sharpening inverting buffers.

9. The frequency-comb radiator of claim 1, where the input signal is a periodic signal.

10. The frequency-comb radiator of claim 1, where the driver stage further comprises a second transistor and a second transmission line, the second transistor connected between the first transistor and the series of buffers and the second transmission line connected between the second transistor and ground.

11. A method of frequency comb radiation, the method comprising:
radiating pulses using an on-chip antenna coupled to a PIN (positive, intrinsic, negative) diode through a matching network;
driving the PIN diode using a driver stage switched by an input signal through a series of buffers, the driver stage comprising a first transistor and a first transmission line, where the first transmission line is connected to an end side of the PIN diode and to the first transistor, and the first transmission line isolates the PIN diode from the first transistor; and
generating Terahertz (THz) pulses using a reverse-recovery of the PIN diode caused by the switching of the driver stage, wherein the THz-pulses are radiated through the on-chip antenna;
wherein the combination of the transistor and transmission line in the driver stage causes the PIN diode to operate in a nonlinear region and the nonlinearity of the PIN diode generates the THz-pulses that are radiated through the on-chip antenna through the matching network.

12. The method of claim 11, wherein a hemispherical, high-impedance silicon lens is positioned under the on-chip antenna.

13. The method of claim 11, wherein a frequency-comb radiation is implemented using a silicon-based technology.

14. The method of claim 11, wherein a frequency-comb radiates a wideband frequency comb in the THz regime through the on-chip antenna.

15. The method of claim 14, wherein a spacing between THz tones is programmed by tuning a frequency of an input trigger.

16. The method of claim 11, further comprising tuning, using a non-linear Q-Switching Impedance (NLQSI) circuit, at least one of amplitude and phase of the frequency tones.

17. The method of claim 11, wherein the on-chip antenna is a coplanar waveguide-fed (CPW) slot bow-tie antenna.

18. The method of claim 11, wherein the driver stage is switched by a series of edge-sharpening inverting buffers.

19. The method of claim 11, where the input signal is a periodic signal.

20. The method of claim 11, where the driver stage further comprises a second transistor and a second transmission line, the second transistor connected between the first transistor and the series of buffers and the second transmission line connected between the second transistor and ground.

* * * * *